United States Patent
Wu et al.

(10) Patent No.: US 11,515,889 B2
(45) Date of Patent: Nov. 29, 2022

(54) UPLINK CONTROL INFORMATION SEGMENTATION FOR POLAR CODES

(71) Applicant: QUALCOMM Incorporated, San Diego, CA (US)

(72) Inventors: Liangming Wu, Beijing (CN); Changlong Xu, Beijing (CN); Jing Jiang, San Diego, CA (US); Gabi Sarkis, San Diego, CA (US); Yu Zhang, Beijing (CN); Kai Chen, Shenzhen (CN)

(73) Assignee: QUALCOMM Incorporated, San Diego, CA (US)

( * ) Notice: Subject to any disclaimer, the term of this patent is extended or adjusted under 35 U.S.C. 154(b) by 2 days.

(21) Appl. No.: 16/757,794

(22) PCT Filed: Nov. 14, 2018

(86) PCT No.: PCT/CN2018/115455
§ 371 (c)(1),
(2) Date: Apr. 21, 2020

(87) PCT Pub. No.: WO2019/096168
PCT Pub. Date: May 23, 2019

(65) Prior Publication Data
US 2021/0288663 A1    Sep. 16, 2021

(30) Foreign Application Priority Data

Nov. 17, 2017 (WO) ............... PCT/CN2017/111607

(51) Int. Cl.
*H03M 13/00*      (2006.01)
*H03M 13/09*      (2006.01)
(Continued)

(52) U.S. Cl.
CPC .......... *H03M 13/09* (2013.01); *H03M 13/13* (2013.01); *H03M 13/618* (2013.01);
(Continued)

(58) Field of Classification Search
None
See application file for complete search history.

(56) References Cited

U.S. PATENT DOCUMENTS

2005/0278602 A1    12/2005   Oogami et al.
2010/0285796 A1    11/2010   Iwamura et al.
(Continued)

FOREIGN PATENT DOCUMENTS

CN        105227189 A      1/2016
CN        105471801 A      4/2016
(Continued)

OTHER PUBLICATIONS

International Search Report and Written Opinion—PCT/CN2017/111607—ISA/EPO—dated Aug. 17, 2018.
(Continued)

*Primary Examiner* — Mujtaba M Chaudry
(74) *Attorney, Agent, or Firm* — Patterson & Sheridan, L.L.P.

(57) ABSTRACT

Certain aspects of the present disclosure generally relate to wireless communications and, more particularly, to methods and apparatus for segmenting uplink control information prior for encoding using a polar code prior to transmission. An exemplary method that may be performed by a wireless device generally includes iteratively segmenting a group of K information bits into a plurality of segments, encoding the information bits of each of the plurality of segments using a polar code to generate a plurality of encoded segments, and transmitting the plurality of encoded segments.

34 Claims, 14 Drawing Sheets

(51) Int. Cl.
H03M 13/13 (2006.01)
H04L 1/00 (2006.01)
(52) U.S. Cl.
CPC ...... H03M 13/6362 (2013.01); H04L 1/0008 (2013.01); H04L 1/0013 (2013.01); H04L 1/0072 (2013.01)

(56) References Cited

U.S. PATENT DOCUMENTS

| | | | |
|---|---|---|---|
| 2014/0169388 A1 | 6/2014 | Jeong et al. | |
| 2014/0331083 A1* | 11/2014 | Aliev | G06F 11/108 714/6.23 |
| 2015/0249473 A1* | 9/2015 | Li | H03M 13/2957 341/51 |
| 2016/0218743 A1 | 7/2016 | Li et al. | |
| 2016/0285479 A1* | 9/2016 | El-Khamy | H03M 13/616 |
| 2017/0005753 A1* | 1/2017 | Shen | H04L 1/1867 |
| 2017/0012739 A1* | 1/2017 | Shen | H04L 1/0041 |
| 2017/0047947 A1* | 2/2017 | Hong | H03M 13/2906 |
| 2017/0222757 A1* | 8/2017 | Huang | H03M 13/13 |
| 2017/0366199 A1* | 12/2017 | Ge | H04L 1/0053 |
| 2018/0070302 A1* | 3/2018 | Wu | H04L 5/0039 |
| 2018/0097580 A1* | 4/2018 | Zhang | H03M 13/13 |
| 2018/0191459 A1* | 7/2018 | Ge | H04L 1/0009 |
| 2018/0191465 A1* | 7/2018 | Saber | H04J 13/10 |
| 2019/0140784 A1* | 5/2019 | Xi | H04L 1/1845 |
| 2019/0207710 A1* | 7/2019 | Ye | H03M 13/6306 |

FOREIGN PATENT DOCUMENTS

| | | |
|---|---|---|
| CN | 106817195 A | 6/2017 |
| CN | 106888026 A | 6/2017 |
| CN | 107342842 A | 11/2017 |
| WO | 2017023079 A1 | 2/2017 |
| WO | 2017097098 A1 | 6/2017 |

OTHER PUBLICATIONS

International Search Report and Written Opinion—PCT/CN2018/115455—ISA/EPO—dated Jan. 30, 2019.

NTT Docomo, Inc. "Work plan for Rel-15 NR WI," 3GPP TSG RAN WG1 Meeting #90, R1-1713892, Aug. 25, 2017, 104 pages.
Huawei, et al., "Segmentation for Polar codes", 3GPP Draft, 3GPP TSG RAN WG1 Meeting #90bis, R1-1718372, Segmentation for Polar Codes, 3rd Generation Partnership Project (3GPP), Mobile Competence Centre, 650, Route Des Lucioles, F-06921, Sophia-Antipolis Cedex, France, vol. RAN WG1, No. Prague, CZ; Oct. 9, 2017-Oct. 13, 2017, Oct. 3, 2017 (Oct. 3, 2017), XP051352986, 5 pages, Retrieved from the Internet: URL: http://www.3gpp.org/ftp/tsg_ran/WG1_RL1/TSGR1_90b/Docs/ [retrieved on Oct. 3, 2017], p. 1-p. 2, p. 4, figure 1.
Intel Corporation: "Remaining Issues for Polar Code Construction," 3GPP Draft, 3GPP TSG RAN WG1 Meeting 90bis, R1-1717407, 3rd Generation Partnership Project (3GPP), Mobile Competence Centre, 650, Route Des Lucioles, F-06921, Sophia-Antipolis Cedex, France, vol. RAN WG1, No. Prague, CZ, Oct. 9, 2017-Oct. 13, 2017, Oct. 8, 2017 (Oct. 8, 2017), XP051340596, 7 Pages, Retrieved from the Internet: URL:http://www.3gpp.org/ftp/Meetings_3GPP_SYNC/RAN1/Docs/ [retrieved on Oct. 8, 2017], p. 1, p. 4-p. 6, figures 1,5.
MCC Support: "Draft Report of 3GPP TSG RAN WG1 #90bis v0.1.0," 3GPP Draft, 3GPP TSG RAN WG1 Meeting #91, Draft_Minutes_Report_RAN1#90B_V010, 3rd Generation Partnership Project (3GPP), Mobile Competence Centre; 650, Route Des Lucioles ; F-06921 Sophia-Antipolis Cedex; France, vol. RAN WG1, No. Reno, USA; Nov. 27, 2017-Dec. 1, 2017, Oct. 19, 2017, (Oct. 19, 2017), XP051353748, 174 pages, Retrieved from the Internet: URL: http://www.3gpp.org/ftp/tsg_ran/WG1_RL1/TSGR1_90b/Report/ [retrieved on Oct. 19, 2017], p. 145.
Samsung: "Rate-Matching for Polar Codes", 3GPP Draft, 3GPP TSG RAN WG1 NR Ad-Hoc#3, R1-1716029_Rate-Matching_For_Control_Channels, 3rd Generation Partnership Project (3GPP), Mobile Competence Centre, 650, Route Des Lucioles, F-06921, Sophia-Antipolis Cedex, France, vol. RAN WG1, No. Nagoya, Japan; Sep. 18, 2017-Sep. 21, 2017, Sep. 12, 2017 (Sep. 12, 2017), XP051329694, 12 pages, Retrieved from the Internet: URL: http://www.3gpp.org/ftp/tsg_ran/WG1_RL1/TSGR1_AH/NR_AH_1709/Docs/ [retrieved on Sep. 12, 2017], p. 2, figure 1.
Supplementary European Search Report—EP18878437—Search Authority—Munich—dated Jul. 16, 2021.

* cited by examiner

UPLINK CONTROL INFORMATION SEGMENTATION FOR POLAR CODES

CROSS-REFERENCE TO RELATED APPLICATIONS

This application for Patent is a national stage application under 35 U.S.C. § 371 of PCT/CN2018/115455, filed Nov. 14, 2018, which claims benefit of and priority to PCT International Application No. PCT/CN2017/111607, filed Nov. 17, 2017 which are both assigned to the assignee hereof and hereby expressly incorporated by reference herein in their entireties as if fully set forth below and for all applicable purposes.

TECHNICAL FIELD

Certain aspects of the present disclosure generally relate to wireless communications and, more particularly, to methods and apparatus for segmenting uplink control information prior for encoding using a polar code prior to transmission.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies induce Long Term Evolution (LTE) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SC DMA) systems.

In some examples, a wireless multiple-access communication system may include a number of base stations, each simultaneously supporting communication for multiple communication devices, otherwise known as user equipment (UEs). In LTE or LTE-A network, a set of one or more base stations may define an e NodeB (eNB). In other examples (e.g., in a next generation or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more distributed units, in communication with a central unit, may define an access node (e.g., a new radio base station (NR BS), a new radio node-B (NR NB), a network node, 5G NB, gNB, etc.). A base station or DU may communicate with a set of UEs on downlink channels (e.g., for transmissions from a base station or to a UE) and uplink channels (e.g., for transmissions from a UE to a base station or distributed, unit).

These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. NR is a set of enhancements to the LTE mobile standard promulgated by Third Generation Partnership Project (3GPP). It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

However, as the demand for mobile broadband access continues to increase, there exists a need for further improvements in NR technology. Preferably, these improvements should be applicable to other multi-access technologies and the telecommunication standards that employ these technologies.

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications in a wireless network.

Certain aspects of the present disclosure provide a method for wireless communications in a network. The method generally includes iteratively segmenting a group of K information bits into a plurality of segments, encoding the information bits of each of the plurality of segments using a polar code to generate a plurality of encoded segments, and transmitting the plurality of encoded segments.

Certain aspects of the present disclosure provide a method for communications in a network. The method generally includes determining, based on one or more of a payload size of a group of information bits and parameters of a polar code, to segment the group of information bits into a plurality of segments, wherein the payload size is K, segmenting the group of information bits into the plurality of segments, encoding the information hits of each of the plurality of segments using the polar code to generate a plurality of encoded segments, and transmitting the plurality of encoded segments.

Certain aspects of the present disclosure provide an apparatus for wireless communications in a network. The apparatus generally includes a processor configured to iteratively segment a group of K information bits into a plurality of segments, to encode the information bits of each of the plurality of segments using a polar code to generate a plurality of encoded segments, and to cause the apparatus to transmit the plurality of encoded segments, and a memory coupled with the processor.

Certain aspects of the present disclosure provide an apparatus for wireless communications in a network. The apparatus generally includes a processor configured to determine, based on one or more of a payload size of a group of information bits and parameters of a polar code, to segment the group of information bits into a plurality of segments, wherein the payload size is K, to segment the group of information bits into the plurality of segments, to encode the information bits of each of the plurality of segments using the polar code to generate a plurality of encoded segments, and to cause the apparatus to transmit the plurality of encoded segments, and a memory coupled with the processor.

Certain aspects of the present disclosure provide an apparatus for wireless communications in a network. The apparatus generally includes means for iteratively segmenting a group of K information bits into a plurality of segments, means for encoding the information bits of each of the plurality of segments using a polar code to generate a plurality of encoded segments, and means for transmitting the plurality of encoded segments.

Certain aspects of the present disclosure provide an apparatus for wireless communications in a network. The apparatus generally includes means for determining, based on one or more of a payload size of a group of information hits and parameters of a polar code, to segment the group of information bits into a plurality of segments, wherein the payload size is K, means for segmenting the group of information hits into the plurality of segments, means for encoding the information bits of each of the plurality of segments using the polar code to generate a plurality of encoded segments, and means for transmitting the plurality of encoded segments.

Certain aspects of the present disclosure provide a computer-readable medium for wireless communications in a network. The computer-readable medium generally includes instructions that, when executed by at least one processor, cause the at least one processor to iteratively segment a group of K information bits into a plurality of segments, to encode the information bits of each of the plurality of segments using a polar code to generate a plurality of encoded segments, and to transmit the plurality of encoded segments.

Certain aspects of the present disclosure provide a computer-readable medium for wireless communications in a network. The computer-readable medium generally includes instructions that, when executed by at least one processor, cause the at least one processor to determine, based on one or more of payload size of a group of information bits and parameters of a polar code, to segment the group of information bits into a plurality of segments, wherein the payload size is K, to segment the group of information bits into the plurality of segments, to encode the information bits of each of the plurality of segments using the polar code to generate a plurality of encoded segments, and to transmit the plurality of encoded segments.

Numerous other aspects are provided including methods, apparatus, systems, computer program products, and processing systems.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
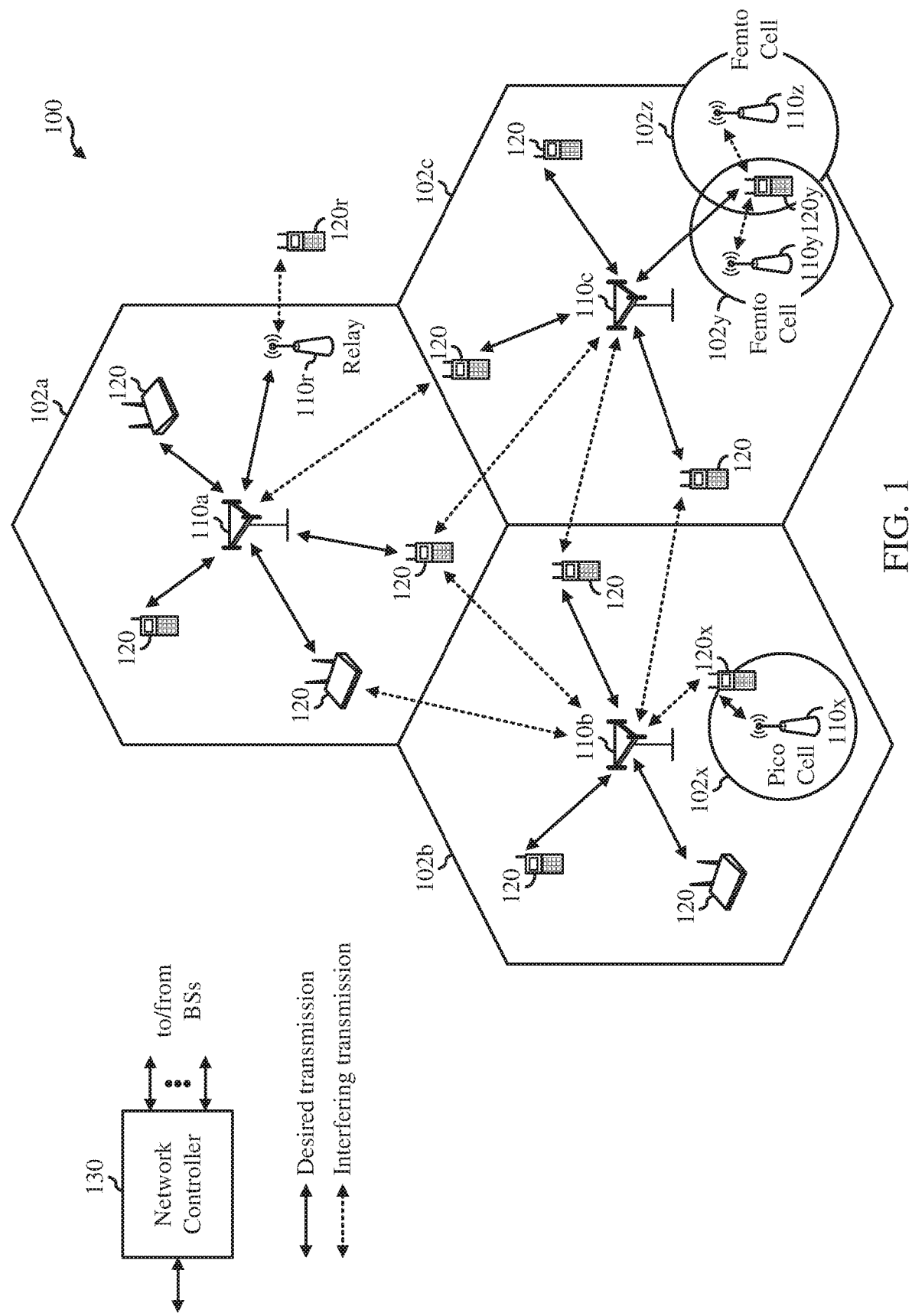
FIG. 1 is a block diagram conceptually illustrating an example telecommunications system, in accordance with certain aspects of the present disclosure.

Aspects of the present disclosure provide apparatus, methods, processing systems, and computer readable mediums for multi-slice networks, such as new radio (NR) (new radio access technology or 5G technology).

New radio (NR) may refer to radios configured to operate according to a new air interface (e.g., other than Orthogonal Frequency Divisional Multiple Access (OFDMA)-based air interfaces) or fixed transport layer (e.g., other than Internet Protocol (IP)). NR may include Enhanced mobile broadband (eMBB) services targeting wide bandwidth (e.g. 80 MHz and wider) communications, millimeter wave (mmW) services targeting high carrier frequency (e.g., 27 GHz and higher) communications, massive machine-type communications (mMTC) services targeting non-backward compatible machine-type communications (MTC) techniques, and mission critical services targeting ultra reliable low latency communications (URLLC). These services may include latency and reliability requirements. These services may also have different transmission time intervals (TTI) to meet respective quality of service (QoS) requirements. In addition, these services may co-exist in the same subframe.

Aspects of the present disclosure relate to a rate-matching scheme for control channels using polar codes. Rate matching is a process whereby the number of bits to be transmitted is matched to the available bandwidth of the number of bits allowed to be transmitted. In certain instances the amount of data to be transmitted is less than the available bandwidth, in which case all the data to be transmitted (and one or more copies of the data) will be transmitted (a technique called repetition). In other instances the amount of data to be transmitted exceeds the available bandwidth, in which case a certain portion of the data to be transmitted will be omitted from the transmission (a technique called puncturing).

In NR, polar codes may be used to encode a stream of hits or transmission. However, in some cases, using a traditional rate matching scheme e.g., for TBCC codes) may lead to performance loss when used with polar codes. Thus, aspects of the present disclosure propose an efficient rate-matching scheme to be used to rate-match a stream of bits encoded using a polar code.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are, intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as CDMA, TDMA, FDMA, OFDMA, SC-FDMA and other networks. The terms "network" and "system" are often used interchangeably. A CDMA network may implement a radio technology such as universal terrestrial radio access (UTRA), cdma2000, etc. UTRA includes wideband CDMA (WCDMA), time division synchronous CDMA (TD-SCDMA), and other variants of CDMA. cdma2000 covers IS-2000, IS-95 and IS-856 standards. A TDMA network may implement a radio technology such as global system for mobile communications (GSM). An OFDMA network may implement a radio technology such as evolved UTRA (E-UTRA), ultra mobile broadband (UMB), IEEE 802.11 (Wi-Fi), IEEE 802.16 (WiMAX), IEEE 802.20, Flash-OFDM®, etc. UTRA and E-UTRA are part of universal mobile telecommunication system (UMTS). 3GPP Long Term Evolution (LIE) and LIE-Advanced (LIE-A), in both frequency division duplex (FDD) and time division duplex (TDD), are new releases of UMTS that use E-UTRA, which employs OFDMA on the downlink and SC-FDMA on the uplink. LIRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies, such as a 5G next-generation or NR network.

Example Wireless Communications System

FIG. 1 illustrates an example wireless network 100, such as a new radio (NR) or 5G network, in which aspects of the present disclosure may be performed, for example, for improving device discovery in a multi-slice network. In some cases, the network 100 may be a multi-slice network, each slice defines as a composition of adequately configured network functions, network applications, and underlying cloud infrastructures that are bundled together to meet the requirement of a specific use case or business model.

As illustrated in FIG. 1, the wireless network 100 may include a number of BSs 110 and other network entities. A BS may be a station that communicates with UEs. Each BS 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and eNB, Node B, 5G NB, AP, NR BS, NR BS, BS, or TRP may be interchangeable. In some examples, a cell may not necessarily be stationary, and the geographic area of the cell may move according to the location of a mobile base station. In some examples, the base stations may be interconnected to one another and/or to one or more other base stations or network nodes (not shown) in the wireless network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed, employing a multi-slice network architecture.

A BS may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BS for the femto cells 102y and 102z, respectively. A BS may support one or multiple (e.g., three) cells.

The wireless network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

The wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, macro BS may have a high transmit power level (e.g., 20 Watts) whereas pico BS, femto BS, and relays may have a lower transmit power level (e.g., 1 Watt).

The wireless network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another, e.g., directly or indirectly via wireless or wireline backhaul.

The UEs 120 (e.g., 120x, 120y, etc.) may be dispersed throughout the wireless network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or medical equipment, a biometric sensor/device, a wearable device such as a smart watch, smart clothing, smart glasses, a smart wrist band, smart jewelry a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered evolved or machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices.

In FIG. 1, a solid line with double arrows indicates desired transmissions between a UE and a serving BS, which is a BS designated to serve the UE on the downlink and/or uplink. A dashed line with double arrows indicates interfering transmissions between a UE and a BS.

Certain wireless networks (e.g., LTE) utilize orthogonal frequency division multiplexing (OFDM) on the downlink and single-carrier frequency division multiplexing (SC-FDM) on the uplink OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz (i.e., 6 resource blocks), and there may be 1, 2, 4, 8 or 16 subbands for system bandwidth of 1.25, 2.5, 5, 10 or 20 MHz, respectively.

While aspects of the examples described herein may be associated with LIE technologies, aspects of the present disclosure may be applicable with other wireless communications systems, such as NR/5G.

NR may utilize OFDM with a CP on the uplink and downlink and include support for half-duplex operation using TDD. A single component carrier bandwidth of 100 MHz may be supported. NR resource blocks may span 12 sub-carriers with a subcarrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., DL or UL) for data transmission and the link direction for each subframe may be dynamically switched. Each subframe may include DL/UL, data as well as DL/UL control data. UL and DL subframes for NR may be as described in more detail below with reference to FIGS. 9 and 10. Beamforming may be supported and beam direction may be dynamically configured, MIMO transmissions with precoding may also be supported. MIMO configurations in the DI, may support up to 8 transmit antennas with multi-layer DI, transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such CUs and/or DUs.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time frequency resources and having a cellular configuration, a P2P configuration, and a mesh configuration, a scheduling entity and one or more subordinate entities may communicate utilizing the scheduled resources.

As noted above, a RAN may include a CU and DUs. A NR BS (e.g., gNB, 5G Node B, Node B, transmission reception point (TRP), access point (AP)) may correspond to one or multiple BSs. NR cells can be configured as access cell (ACells) or data only cells (DCells). For example, the RAN (e.g., a central unit or distributed unit) can configure the cells. DCells may be cells used for carrier aggregation or dual connectivity, but not used for initial access, cell selection/reselection, or handover. In some cases DCells may not transmit synchronization signals in some case cases DCells may transmit SS, NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 2:
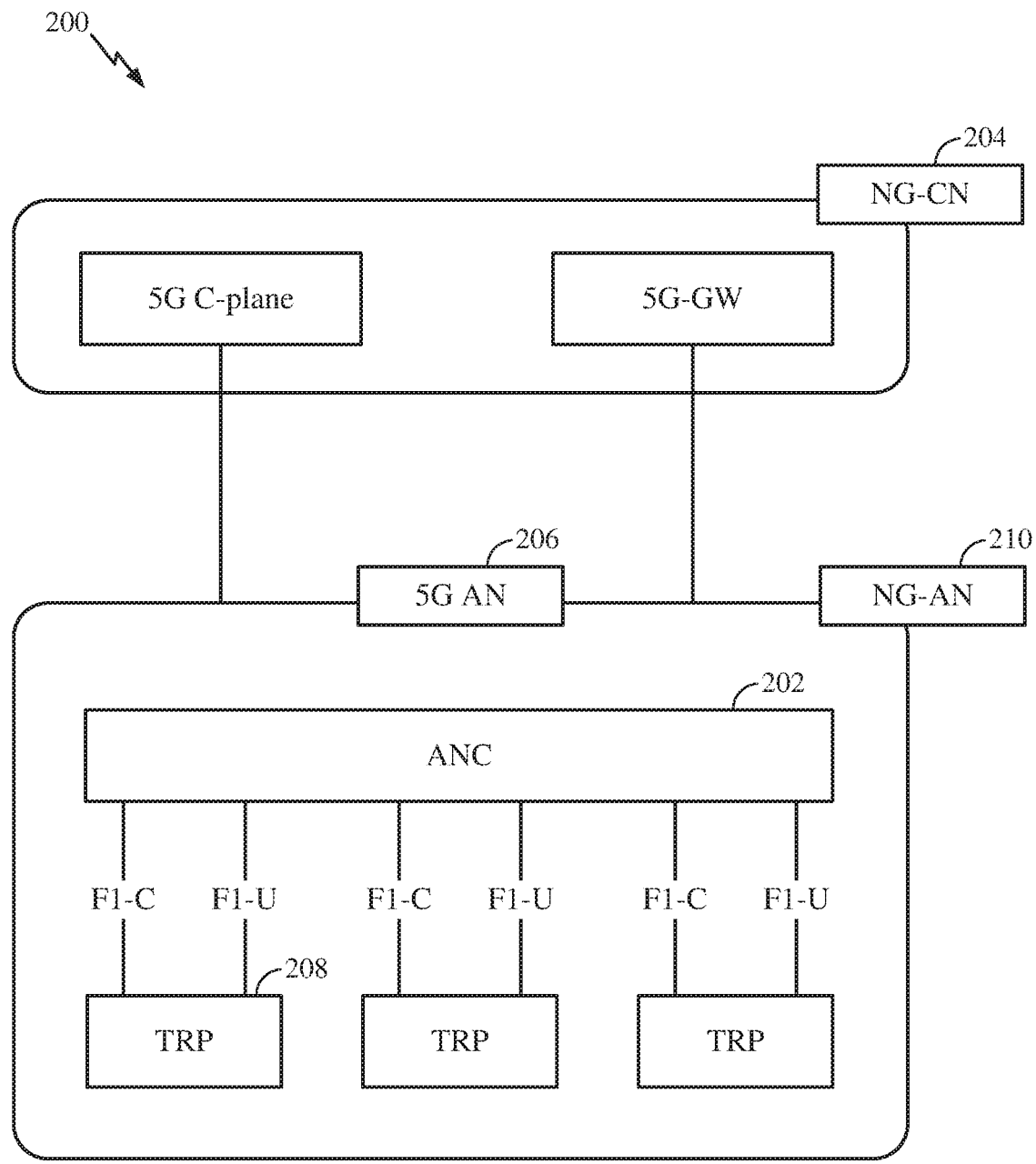
FIG. 2 is a block diagram illustrating an example logical architecture of a distributed RAN, in accordance with certain aspects of the present disclosure.

FIG. 2 illustrates an example logical architecture of a distributed radio access network (RAN) 200, which may be implemented in the wireless communication system illustrated in FIG. 1. A 5G access node 206 may include an access node controller (ANC) 202. The ANC may be a central unit (CU) of the distributed RAN 200. The backhaul interface to the next generation core network (NG-CN) 204 may terminate at the ANC. The backhaul interface to neighboring next generation access nodes (NG-ANs) may terminate at the ANC. The ANC may include one or more TRPs 208 (which may also be referred to as BSs, NR BSs, Node Bs, 5G NBs, APs, or some other term). As described above, a TRP may be used interchangeably with "cell."

The TRPs 208 may be a DU. The TRPs may be connected to one ANC (ANC 202) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture 200 may be used to illustrate fronthaul definition. The architecture may be defined that support fronthauling solutions across different deployment types. For example, the architecture may be based on transmit network capabilities (e.g., bandwidth, latency, and/or jitter).

The architecture may share features and/or components with LTE. According to aspects, the next generation AN (NG-AN) 210 may support dual connectivity with NR. The NG-AN may share a common fronthaul for LTE and NR.

The architecture may enable cooperation between and among TRPs 208. For example, cooperation may be preset within a TRP and/or across TRPs via the ANC 202. According to aspects, no inter-TRP interface may be needed or present.

According to aspects, a dynamic configuration of split logical functions may be present within the architecture 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU or CU (e.g., TRP or ANC, respectively). According to certain aspects, a BS may include a central unit (CU) (e.g., ANC 202) and/or one or more distributed units (e.g., one or more TRPs 208).

Figure 3:
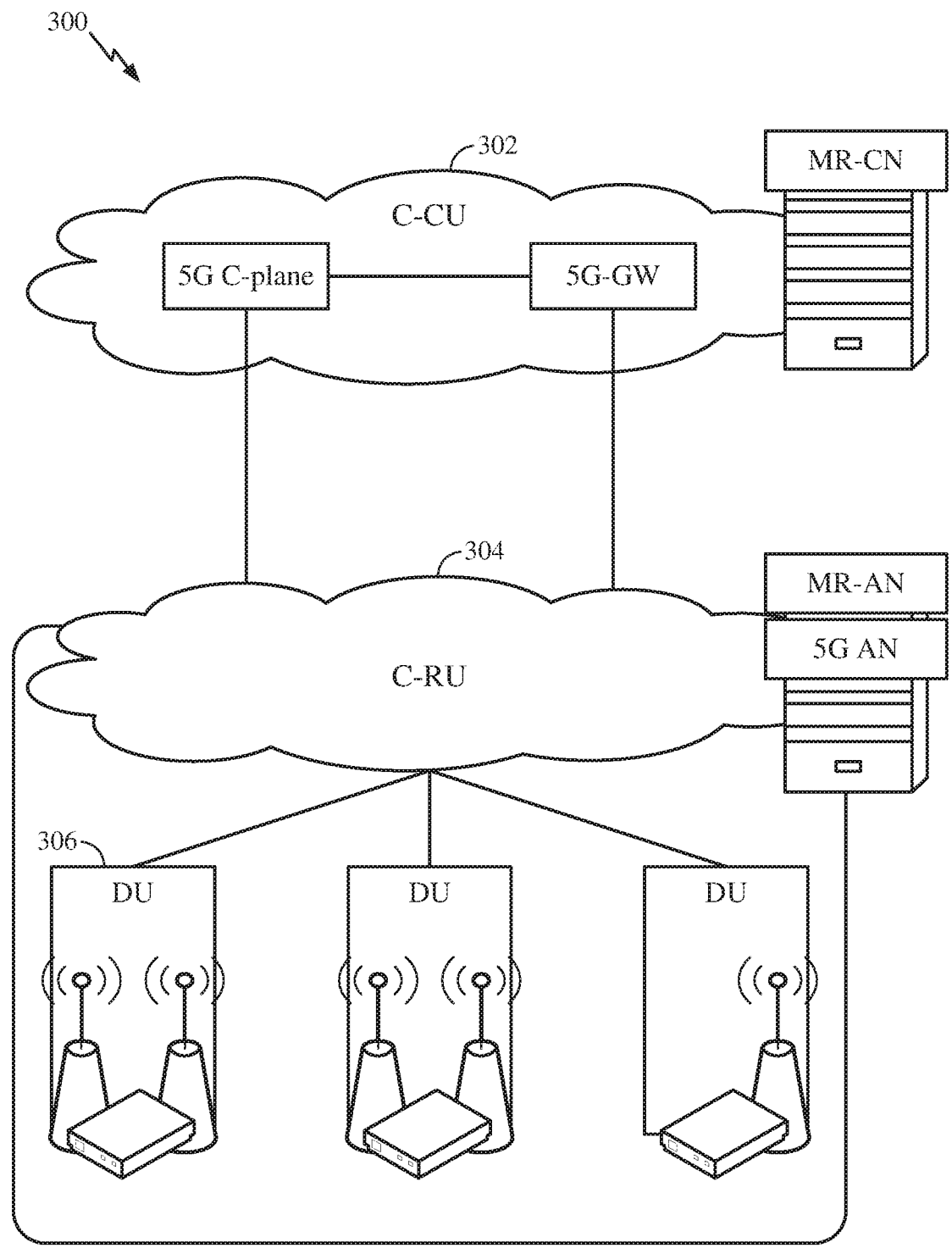
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. The C-CU may be centrally deployed. C-CU functionality may be offloaded (e.g., to advanced wireless services (AWS)), in an effort to handle peak capacity.

A centralized RAN unit (C-RU) 304 may host one or more ANC functions. Optionally, the C-RU may host core network functions locally. The C-RU may have distributed deployment. The C-RU may be closer to the network edge.

A DU 306 may host one or more TRPs (edge node (EN), an edge unit (EU), a radio head (RH), a smart radio head (SRH), or the like). The DU may be located at edges of the network with radio frequency (RF) functionality.

Figure 4:
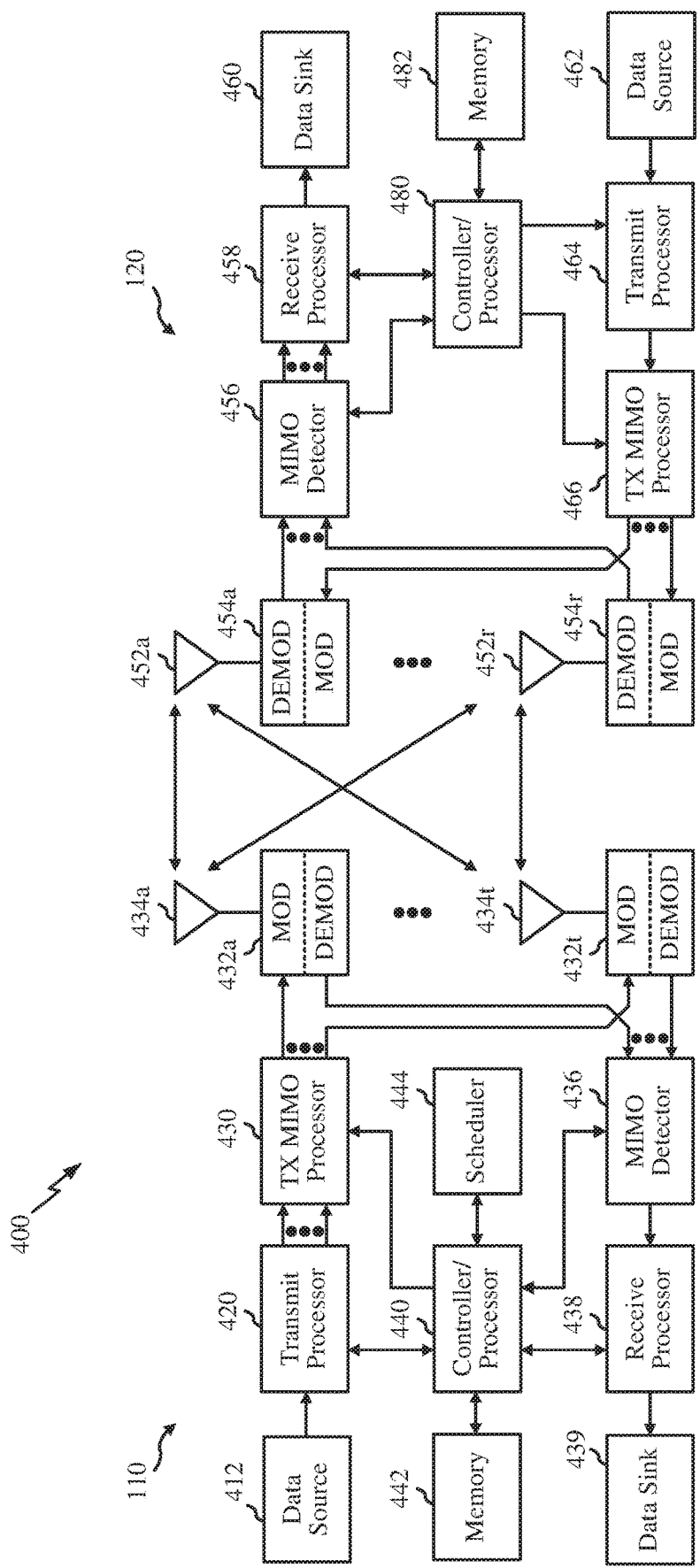
FIG. 4 is a block diagram conceptually illustrating a design of an example BS and user equipment (UE), in accordance with certain aspects of the present disclosure.

FIG. 4 illustrates example components of the BS 110 and UE 120 illustrated in FIG. may be used to implement aspects of the present disclosure. As described above, the BS may include a TRP. One or more components of the BS 110 and UE 120 may be used to practice aspects of the present disclosure. For example, antennas 452, modulator/demodulators 454, TX MIMO processor 466, receive processor 458, transmit processor 464, and/or controller/processor 480 of the UE 120 and/or antennas 434, modulator/demodulators 432, TX MIMO processor 430, transmit processor 420, receive processor 438, and/or controller/processor 440 of the BS 110 may be used to perform the operations described herein and illustrated with reference to FIGS. 15-16.

According to aspects, for a restricted association scenario, the base station 110 may be the macro BS 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the Physical Broadcast Channel (PBCH), Physical Control Format indicator Channel (PCFICH), Physical Hybrid ARQ Indicator Channel (PHICH), Physical Downlink Control Channel (PDCCH), etc. The data may be for the Physical Downlink Shared Channel (PDSCH), etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at the UE 120, a transmit processor 464 may receive and process data (e.g., for the Physical Uplink Shared Channel (PUSCH)) from a data source 462 and control information (e.g., for the Physical Uplink Control Channel (PUCCH) from the controller/processor 480. The transmit processor 464 may also generate, reference symbols for a reference signal. The symbols from the transmit processor 464 may be precoded by a TX MIMO processor 466 if applicable, further processed by the demodulators 454a through 454r (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the base station 110 and the UE 120, respectively. The processor 440 and/or other processors and modules at the base station 110 may perform or direct, e.g., the execution of the functional blocks illustrated in FIG. 6, and/or other processes for the techniques described herein. The processor 480 and/or other processors and modules at the UE 120 may also perform or direct, e.g., the execution of the functional blocks illustrated in FIG. 7, and/or other processes for the techniques described herein. The memories 442 and 482 may store data and program codes for the BS 110 and the UE 120, respectively. A scheduler 444 may schedule UEs for data transmission on the downlink and/or uplink.

Figure 5:
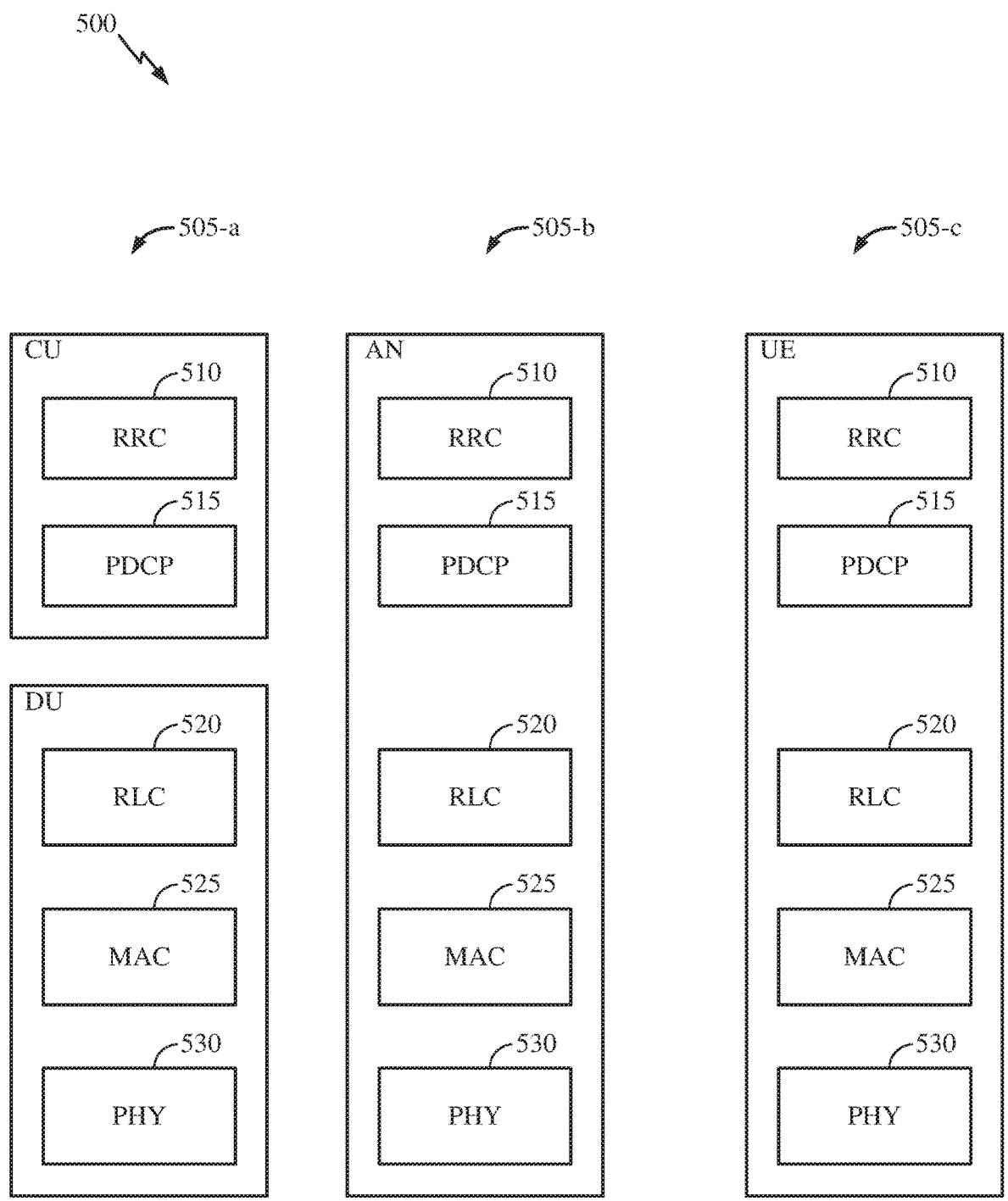
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a 5G system a system that supports uplink-based mobility). Diagram 500 illustrates a communications protocol stack including a Radio Resource Control (RRC) layer 510, a Packet Data Convergence Protocol (PDCP) layer 515, a Radio Link Control (RLC) layer 520, a Medium Access Control (MAC) layer 525, and a Physical (PHY) layer 530. In various examples the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., an ANC 202 in FIG. 2) and distributed network access device (e.g., DU 208 in FIG. 2). In the first option 505-a, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device (e.g., access node (AN), new radio base station (NR BS), a new radio Node-B (NR NB), a network node (NN), or the like). In the second option, the RRC layer 510, the PDCP layer 515, the RLC layer 520, the MAC layer 525, and the PHY layer 530 may each be implemented by the AN. The second option 505-h may be useful in a femto cell deployment.

Regardless of whether a network access device implements part or all of a protocol stack, a UE may implement an entire protocol stack 505-c (e.g., the RRC layer 510, the PDCP layer 515, the RLC layer 520, the MAC layer 525, and the PHY layer 530).

Figure 6:
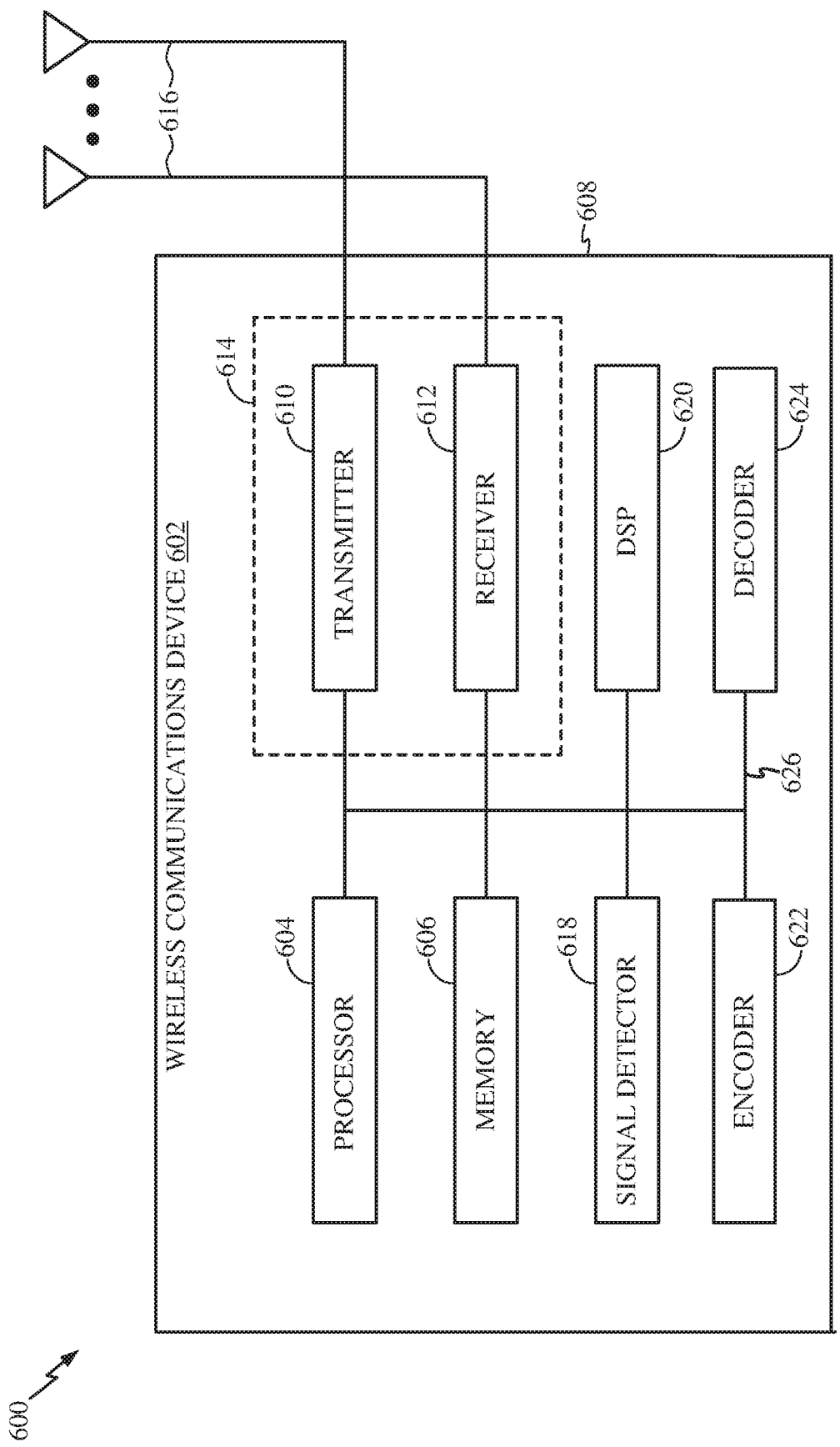
FIG. 6 illustrates a block diagram of an example wireless device in accordance with certain aspects of the present disclosure.

FIG. 6 is a schematic diagram 600 that illustrates various components that may be utilized in a wireless communications device 602 that may be employed within the wireless communication system from FIG. 1. The wireless communications device 602 is an example of a device that may be configured to implement the various methods described herein. The wireless communications device 602 may be BS 110 from FIG. 1 or any of user equipments 120.

The wireless communications device 602 may include a processor 604 which controls operation of the wireless communications device 602. The processor 604 may also be referred to as a central processing unit (CPU). Memory 606, which may include both read-only memory (ROM) and random access memory (RAM), provides instructions and data to the processor 604. A portion of the memory 606 may also include non-volatile random access memory (NVRAM). The processor 604 typically performs logical and arithmetic operations based on program instructions stored within the memory 606. The instructions in the memory 606 may be executable to implement the methods described herein.

The wireless communications device 602 may also include a housing 608 that may include a transmitter 610 and a receiver 612 to allow transmission and reception of data between the wireless device 602 and a remote location. The transmitter 610 and receiver 612 may be combined into a transceiver 614. A single or a plurality of transmit antennas 616 may be attached to the housing 608 and electrically coupled to the transceiver 614. The wireless communications device 602 may also include (not shown) multiple transmitters, multiple receivers, and multiple transceivers.

The wireless communications device 602 may also include a signal detector 618 that may be used in an effort to detect and quantify the level of signals received by the transceiver 614. The signal detector 618 may detect such signals as total energy, energy per subcarrier per symbol, power spectral density and other signals. The wireless communications device 602 may also include a digital signal processor (DSP) 620 for use in processing signals.

Additionally, the wireless communications device 602 may also include an encoder 622 for use in encoding signals for transmission. The encoder may also store the encoded signals in a circular buffer (not shown) and perform rate matching on the encoded signals (e.g., by implementing operations 1600, shown in FIG. 16). Further, the wireless communication device 602 may include a decoder 624 for use in decoding received signals.

The various components of the wireless communications device 602 may be coupled together by a bus system 626, which may include a power bus, a control signal bus, and a status signal bus in addition to a data bus. The processor 604 may be configured to access instructions stored in the memory 606 to perform connectionless access, in accordance with aspects of the present disclosure discussed below.

Figure 7:
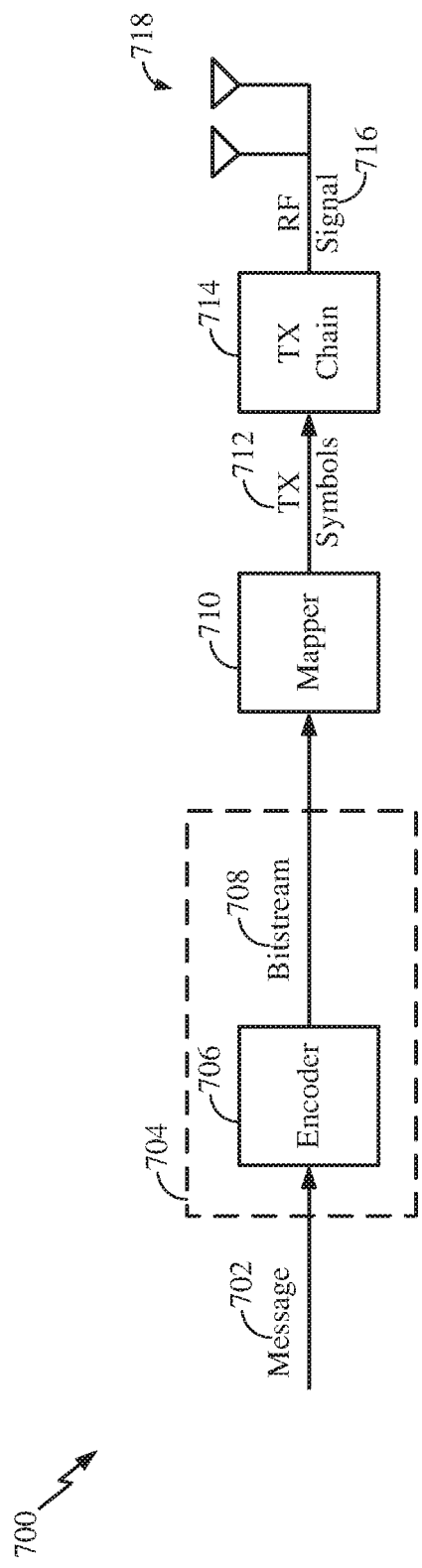
FIG. 7 is a simplified block diagram illustrating an encoder, in accordance with certain aspects of the present disclosure.

FIG. 7 is a simplified block diagram illustrating a portion 700 of a wireless device, in accordance with certain aspects of the present disclosure. The portion includes a radio frequency (RE) modem 704 that may be configured to provide an encoded message for wireless transmission (e.g., using polar codes described below). In one example, an encoder 706 in a wireless device (e.g., BS 110 or a UE 120) receives a message 702 for transmission. The message 702 may contain data and/or encoded voice or other content directed to the receiving device. The encoder 706 encodes the message using a suitable modulation and coding scheme (MCS), typically selected based on a configuration defined by the BS 110 or another network entity. The encoded bitstream 708 may then be stored in circular buffer and rate-matching may be performed on the stored encoded bitstream, for example, according to aspects of the present disclosure described in more detail below. After the encoded bitstream 708 is rate-matched, the encoded bitstream 708 may then be provided to a mapper 710 that generates a sequence of TX symbols 712 that are modulated, amplified and otherwise processed by TX chain 714 to produce an RE signal 716 for transmission through one or more antennas 718.

Figure 8:
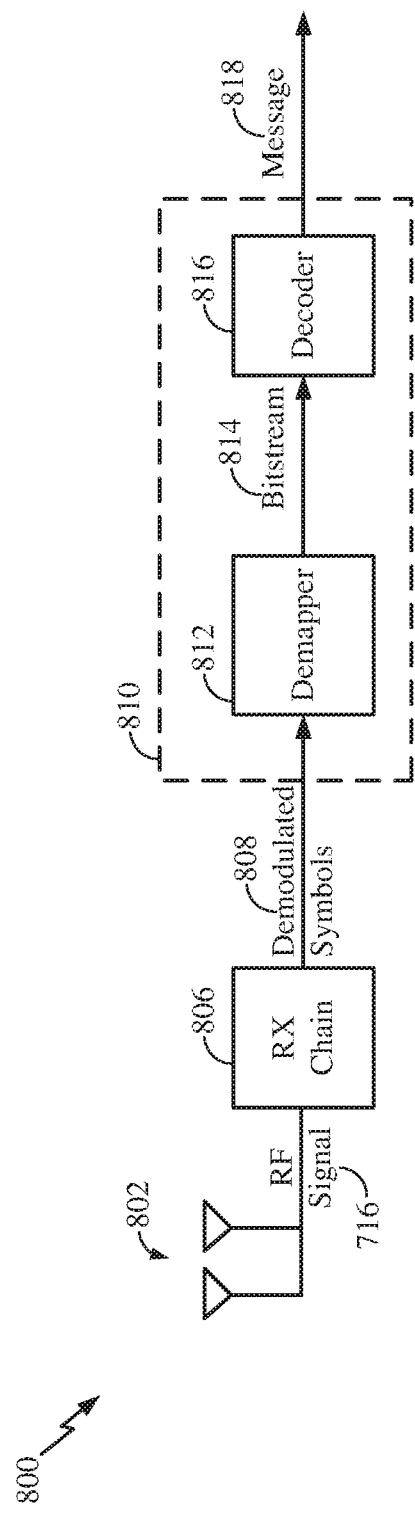
FIG. 8 is a simplified block diagram illustrating a decoder, in accordance with certain aspects of the present disclosure.

FIG. 8 is a simplified block diagram illustrating a portion 800 of a wireless device, in accordance with certain aspects of the present disclosure. The portion includes an RF modem 810 that may be configured to receive and decode a wirelessly transmitted signal including an encoded message (e.g., a message encoded using a polar code as described below). In various examples, the modem 810 receiving the signal may reside at a user equipment, at a base station, or at any other suitable apparatus or means for carrying out the described functions. One or more antennas 802 provides an RF signal 716 (i.e., the RE signal produced in FIG. 7) to an access terminal (e.g., UE 120). An RX chain 806 processes and demodulates the RE signal 716 and may provide a sequence of symbols 808 to a demapper 812, which produces a bitstream 814 representative of the encoded message.

A decoder 816 may then be used to decode m-bit information strings from a bitstream that has been encoded using a coding scheme (e.g., a Polar code). The decoder 816 may comprise a Viterbi decoder, an algebraic decoder, a butterfly decoder, or another suitable decoder. In one example, a Viterbi decoder employs the well-known Viterbi algorithm to find the most likely sequence of signaling states (the Viterbi path) that corresponds to a received bitstream 814. The bitstream 814 may be decoded based on a statistical analysis of LLRs calculated for the bitstream 814. In one example, a Viterbi decoder may compare and select the correct Viterbi path that defines a sequence of signaling states using a likelihood ratio test to generate LLRs from the bitstream 814. Likelihood ratios can be used to statistically compare the fit of a plurality of candidate Viterbi paths using a likelihood ratio test that compares the logarithm of a likelihood ratio for each candidate Viterbi path (i.e. the LLR) to determine which path is more likely to account for the sequence of symbols that produced the bitstream 814. The decoder 816 may then decode the bitstream 814 based on the LLRs to determine the message 818 containing data and/or encoded voice or other content transmitted from the base station (e.g., BS 110).

Figure 9:
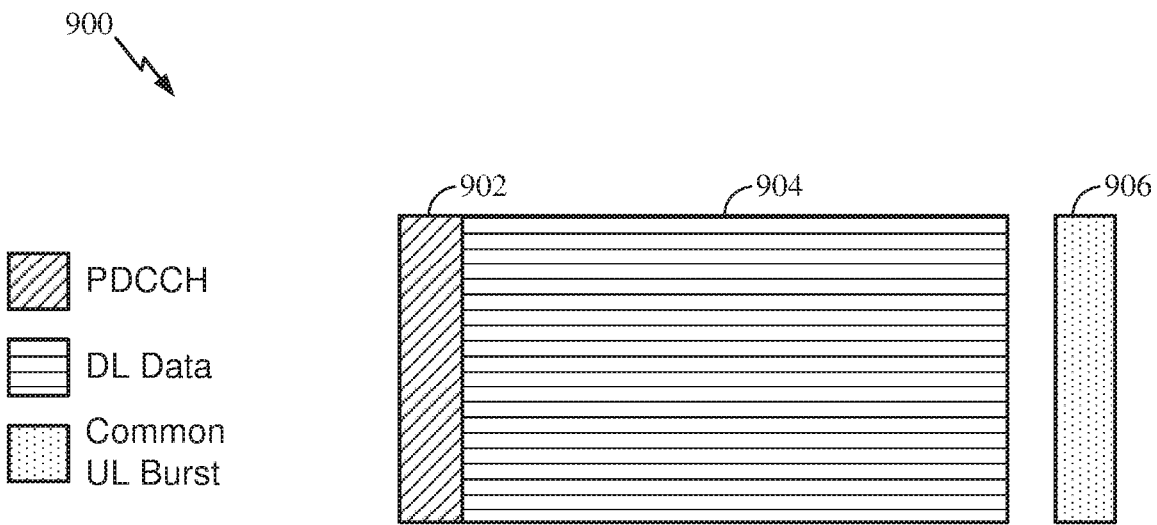
FIG. 9 illustrates an example of a DL-centric subframe, in accordance with certain aspects of the present disclosure.

FIG. 9 is a diagram 900 showing an example of a DL-centric subframe, which may be used by one or more devices (e.g., BS 110 and/or UE 120) to communicate in the wireless network 100. The DL-centric subframe may include a control portion 902. The control portion 902 may exist in the initial or beginning portion of the DL-centric subframe. The control portion 902 may include various scheduling information and/or control information corresponding to various portions of the DL-centric subframe. In some configurations, the control portion 902 may be a physical DL control channel (PDCCH), as indicated in FIG. 9. The DL-centric subframe may also include a DL data portion 904. The DL data portion 904 may sometimes be referred to as the payload of the DL-centric subframe. The DL data portion 904 may include the communication resources utilized to communicate DL data from the scheduling entity (e.g., UE or BS) to the subordinate entity (e.g., UE). In some configurations, the DL data portion 904 may be a physical DL shared channel (PDSCH).

The DL-centric subframe may also include a common UL portion 906. The common UL portion 906 may sometimes be referred to as an UL burst, a common UL burst, and/or various other suitable terms. The common UL portion 906 may include feedback information corresponding to various other portions of the DL-centric subframe. For example, the common UL portion 906 may include feedback information corresponding to the control portion 902. Non-limiting examples of feedback information may include an ACK signal, a NACK signal, a HARQ indicator, and/or various other suitable types of information. The common UL portion 906 may include additional or alternative information, such as information pertaining to random access channel (RACH)

procedures, scheduling requests (SRs), and various other suitable types of information. As illustrated in FIG. 9, the end of the DL data portion 904 may be separated in time from the beginning of the common UL portion 906. This time separation may sometimes be referred to as a gap, a guard period, a guard interval, and/or various other suitable terms. This separation provides time for the switch-over From DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 10:
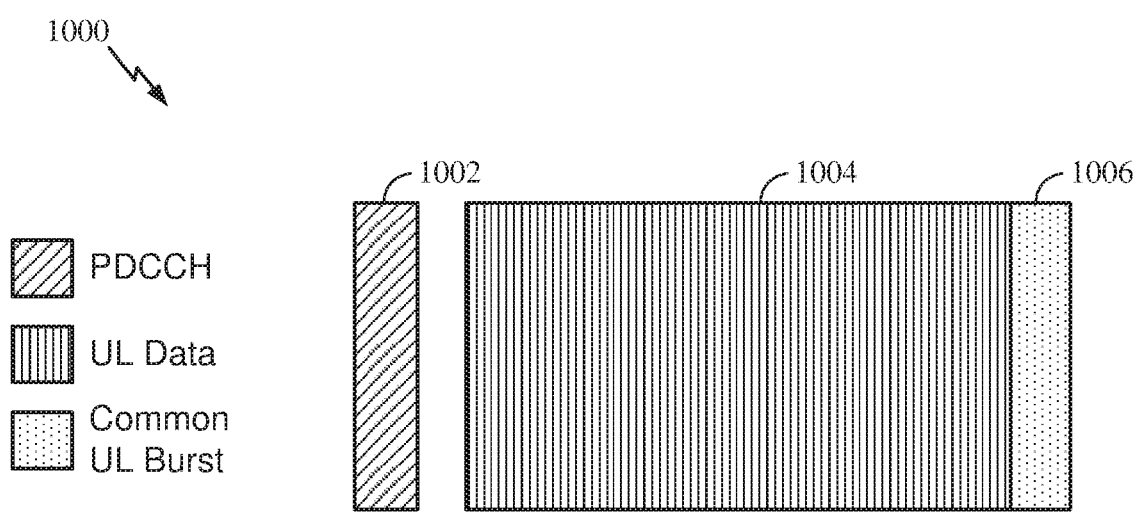
FIG. 10 illustrates an example of an UL-centric subframe, in accordance with certain aspects of the present disclosure.

FIG. 10 is a diagram 1000 showing an example of an UL-centric subframe, which may be used by one or more devices (e.g., BS 110 and/or UE 120) to communicate in the wireless network 100. The UL-centric subframe may include a control portion 1002. The control portion 1002 may exist in the initial or beginning portion of the UL-centric subframe. The control portion 1002 in FIG. 10 may be similar to the control portion described above with reference to FIG. 9. The UL-centric subframe may also include an UL data portion 1004. The UL data portion 1004 may sometimes be referred to as the payload of the UL-centric subframe. The UL portion may refer to the communication resources utilized to communicate UL, data from the subordinate entity (e.g., UE) to the scheduling entity (e.g., UE or BS). In some configurations, the control portion 1002 may be a physical DL control channel (PDCCH).

As illustrated in FIG. 10, the end of the control portion 1002 may be separated in time from the beginning of the UL data portion 1004. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 1006. The common UL portion 1006 in FIG. 10 may be similar to the common UL portion 1006 described above with reference to FIG. 10. The common UL portion 1006 may additional or alternative include information pertaining to channel quality indicator (CO), sounding reference signals (SRSs), and various other suitable types of information. One of ordinary skill in the art will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the Example Polar Codes As noted above, polar codes may be used to encode a stream of bits for transmission. Polar codes are the first provably capacity-achieving coding scheme with almost linear (in block length) encoding and decoding complexity. Polar codes are widely considered as a candidate for error-correction in the next-generation wireless systems. Polar codes have many desirable properties, such as deterministic construction (e.g., based on a fast Hadamard transform), very low and predictable error floors, and simple successive-cancellation (SC) based decoding.

Polar codes are linear block codes of length $N=2^n$, where their generator matrix is constructed using the $n^{th}$ Kronecker power of the matrix, $$G = \begin{pmatrix} 1 & 0 \\ 1 & 1 \end{pmatrix},$$

denoted by $G^n$, also referred to as a Hadamard matrix of order n. For example, Equation (1) shows the resulting generator matrix for n=3.

$$G^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Eq. (1)}$$

According to certain aspects of the present disclosure, a codeword may be generated (e.g., by a BS) by using the generator matrix to encode a number of input bits (e.g., information bits). For example, given a number of input bits $u=(u_0, u_1, \ldots, u_{N-1})$, a resulting codeword vector $x=(x_0, x_1, \ldots, x_{N-1})$ may be generated by encoding the input bits using the generator matrix G. This resulting codeword may then be rate matched (e.g., using techniques described herein) and transmitted by a base station over a wireless medium and received by a UE.

When the received vectors are decoded (e.g., by the UE) using a successive-cancellation (SC) decoder (e.g., decoder 816), every estimated bit, has a predetermined error probability given that bits $u_0^{i-1}$ were correctly decoded, that tends towards either 0 or 0.5. Moreover, the proportion of estimated bits with a low error probability tends towards the capacity of the underlying channel. Polar codes exploit a phenomenon called channel polarization by using the most reliable K bits to transmit information, while setting, or freezing, the remaining (N-K) bits to a predetermined value, such as 0, as explained below.

For very large N, polar codes transform the channel into N parallel "virtual" channels for the N information bits. If C is a proportion representing the capacity of the channel, then there are almost N*C channels which are completely noise free and there are N*(1-C) channels which are completely noisy. The basic polar coding scheme then involves freezing (i.e., not transmitting) the information bits to be sent along the completely noisy channel and sending information only along the perfect channels. For small-to-medium N, this polarization may not be complete in the sense that there could be several channels which are neither completely useless nor completely noise-free (i.e., channels that are in transition). Depending on the rate of transmission, these channels in transition are either frozen or are used for transmission.

Example Uplink Control Information Segmentation for Polar Codes

In previously known wireless communications techniques using NR-polar codes, uplink control information (UCI) may be segmented into two segments with equal segment sizes (with a single zero-padding bit inserted at the beginning of the first segment if needed), for certain ranges of K (before segmentation) and R, e.g., K>=a first threshold (e.g., 352) and R<=a second threshold (e.g., 0.4). Exact values may be determined after future study of wireless communications using NR-polar codes. Segmentation of large UCI may be desirable, in order to reduce the decoding complexity at low coding gain loss.

According to aspects of the present disclosure, when UCI that is segmented is to be encoded using a polar code, a CRC calculated using a polynomial and based on the first segment (and not the second segment) is appended to the first segment. Another CRC is calculated using the same polynomial based on the second segment (and not the first segment) and appended to the second segment.

In aspects of the present disclosure, UCI payload size can be very large; for example, up to 927 bits of data is transmitted per calculation of Type-II CSI with L=4, rank=2, 18 subbands for a single CSI reporting. If multiple CSI reporting is triggered, then more data is transmitted than when a single CSI is triggered.

According to aspects of the present disclosure, a maximum supported mother code length of polar codes (Nmax) for UI, may be used as a parameter in determining whether to segment data for transmission.

In aspects of the present disclosure, a wireless device may determine to segment a set of K data bits, based on K being greater than a parameter (e.g., K>K_max, a threshold payload size), regardless of the rate (e.g., KIM, where. M is the number of bits transmitted in the transmission) to be used in transmitting the K bits.

According to aspects of the present disclosure, K_max can be pre-defined, e.g., K_max=1013.

In aspects of the present disclosure, K_max can be configurable, i.e., K_max=a*Nmax, where a is a parameter configurable by the network.

In previously known techniques, padding added to a first packet, if K is odd, may be insufficient to make the segmented packets (e.g., the first and second packets) the same size.

According to aspects of the present disclosure, a set of data bits may be segmented in more than two segments.

In aspects of the present disclosure, a wireless device may determine to segment a set of K data bits based on K being greater than a threshold number of data bits (i.e., K>K_thr), a coding rate (R) for the transmission being greater than a threshold (i.e., R>R_thr), and a coded bit length (M) being greater than a threshold (M>M_thr). For example, a wireless device may be configured with a threshold number of data bits K_thr=384, a threshold coding rate R=0.2, and a threshold coded bit length M_thr=Nmax (i.e., the maximum mother code length of polar codes supported by the wireless device). In the example, the wireless device determines to transmit 400 bits of data, and the wireless device determines that channel conditions indicate the code rate for the transmission should be 0.4. Still in the example, if encoding the 400 bits of data with a coding rate of 0.4 results in a coded bit length M that is greater than the maximum supported code length of polar codes of the wireless device (Nmax), then the wireless device determines to segment the 400 bits of data into two or more segments before encoding and transmitting the data.

According to aspects of the present disclosure, a wireless device may determine to segment a set of K (e.g., a payload size of K) data bits based on K being greater than or equal to a threshold number (e.g., a threshold payload size) of data bits (i.e., K≥K_thr) and a coded bit length (e.g., a rate matching output sequence length, M) being greater than or equal to a threshold (M≥M_thr). For example, a wireless device may be configured with a threshold number of data bits (i.e., a threshold payload size) K_thr=384 and a threshold coded bit length (i.e., a threshold rate matching output sequence length) M_thr=Nmax+Nmax/16 (i.e., 1.0625× the maximum mother code length of polar codes supported by the wireless device). In the example, the wireless device determines to transmit 400 bits of data (i.e., a payload size K=400), and the wireless device determines that the 400 data bits will be encoded in 1.1× Nmax encoded bits (i.e., a rate matching output sequence length M=1.1× Nmax). Still in the example, the wireless device determines to segment the 400 bits of data into two or more segments before encoding and transmitting the data, based on the number of data bits (i.e., the payload size K) being greater than the threshold number of data bits (i.e., the threshold payload size, K_thr=384) and the number of coded bits (i.e., the rate matching output sequence length M) being greater than the threshold coded bit length (i.e., the threshold rate matching sequence length) M_thr=Nmax+Nmax/16.

In another example, a wireless device may be configured with a threshold number (i.e., a threshold payload size) of data bits K_thr=360 and a threshold coded bit length (i.e., a threshold rate matching output sequence length)=1088. In the example, the wireless device determines to transmit 448 bits of data, and the wireless device determines that channel conditions indicate that the data should be encoded using a coding rate of 0.4. Still in the example, the wireless device determines that the coded bit length (i.e., the rate matching output sequence length) is 448/0.4=1120. Continuing the example, the wireless device determines to segment the 448 bits of data into two segments before encoding and transmitting the data, based on: (1) the number of bits of data (i.e., payload size), K=448, being greater than the threshold number of data bits, K_thr=360; and (2) the coded bit length (i.e., the rate matching output sequence length), M=1120, being greater than the threshold coded bit length (i.e., the threshold rate matching output sequence length), M_thr=1088.

According to aspects of the present disclosure, a wireless device may determine to segment a set of K data bits based on comparing a coding rate, R_seg, for transmitting the data with segmentation being less than a coding rate, R_noseg, for transmitting the data without segmentation. The coding rate, R_seg, for transmitting the data with segmentation may be calculated as:

$$R\_seg=((K/2)+CRC)/\min(2^{order\_seg},(M/2)),$$

while the coding rate, R_noseg, for transmitting the data without segmentation may be calculated as:

$$R\_noseg=(K+CRC)/\min(2^{order},(M))$$

where:
CRC is a length of a CRC (e.g., 16 bits) calculated based on the K data bits,
$2^{order\_seg}$ represents a mother code length of a polar code after rate matching with segmentation,
$2^{order}$ represents a mother code length of a polar code after rate matching without segmentation, and
M represents a coded bit length.

In aspects of the present disclosure, when a coded bit length, M, is an odd number before segmentation, the first packet and second packet are constructed with a number of bits $M'=\lfloor M/2 \rfloor$, i.e., M/2 rounded down to the next integer. This may enable using a same code construction for the two packets. The additional bit (because M is an odd number and each of the first and second packet has $M' \lfloor M/2 \rfloor$ bits) is allocated to either the first or second packet, which is done by reading out the additional bit from the circular buffer.

According to aspects of the present disclosure, a wireless device may divide M coded bits into L≥2 segmented packets, where each segmented packet has a number of coded bits M' equal to M divided by L and rounded up, i.e., $M'=\lceil M/L \rceil$. If mod(M, L)>0, then the first through mod(M, L) packets are each allocated with one bit more than the remaining packets, the first mod(M, L) packets are allocated $M'=\lceil M/L \rceil$ bits, while the remaining L mod(M, L) packets are allocated M' 1=⌊M/L⌋ 1 bits.

Figure 11:
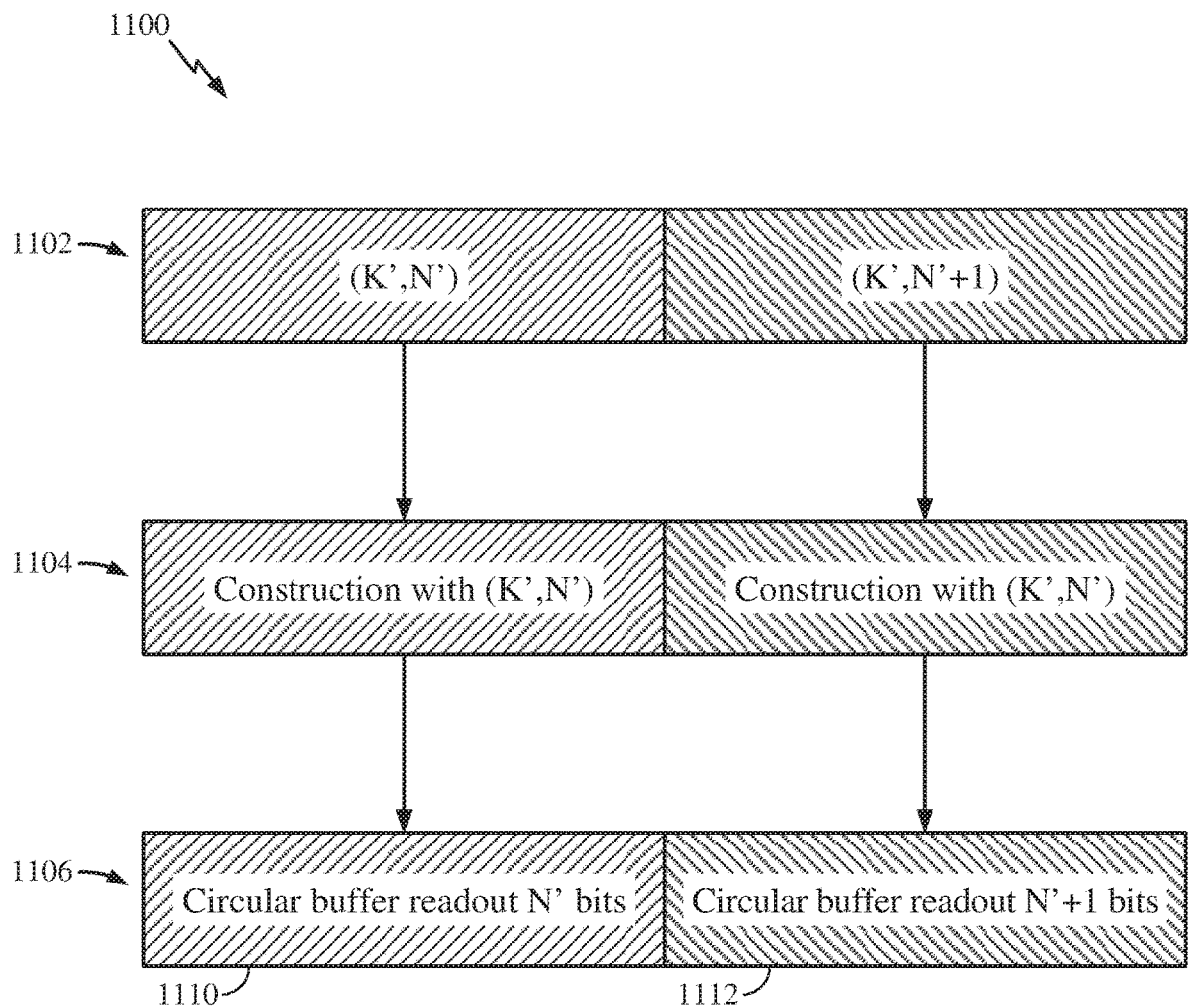
FIG. 11 illustrates an example process for segmenting bits into two packets, according to aspects of the present disclosure.

FIG. 11 illustrates an example procedure 1100 for segmenting bits into two packets. In the exemplary procedure, a stream of N bits is segmented into two packets with N' hits in the first packet and N'+1 bits in the second packet (i.e., 1 more bit is allocated to the second packet than to the first packet) at 1102. At 1104, a polar code of size K' bits is constructed based on encoding N' data bits per packet. At 1106, N' bits are read out of a circular buffer and encoded with the polar code to populate the first packet 1110, while N'+1 bits are read out and encoded with the polar code to populate the second packet 1112.

In aspects of the present disclosure, techniques for using a same polar code construction for 2 segmented packets of different sizes are provided. When using a same polar code for 2 packets of different sizes, the following techniques may govern how the extra 1 hit (i.e., the additional hit for the packet of the larger size, as described herein) is read out from a circular buffer. If data is being shortened, the additional bit in the second packet is read out from the next non-shortened bit (i.e., the starting location bit). If data is being punctured, the additional bit in the second packet is read out from the next bit after the end location, i.e., the start location. If data is being repeated, the additional hit in the second packet is read out from the next bit after the end location.

Repetition, puncturing, and shortening of data for encoding with polar codes are known techniques, according to previously known technologies (e.g., 3GPP). In those techniques, the $N=2^n$ coded bits at the output of a polar encoder are written into a length-N circular buffer in an order that is predefined for a given value of N. Then to obtain M coded bits for transmission, puncturing is realized by selecting bits from position (N−M) to position (N−1) from the circular buffer to be punctured. Shortening is realized by selecting bits from position 0 to position M−1 from the circular buffer to be shortened. Repetition is realized by selecting all bits from the circular buffer, and additionally repeat (M−N) consecutive bits with the smallest indices from the circular buffer.

Figure 12:
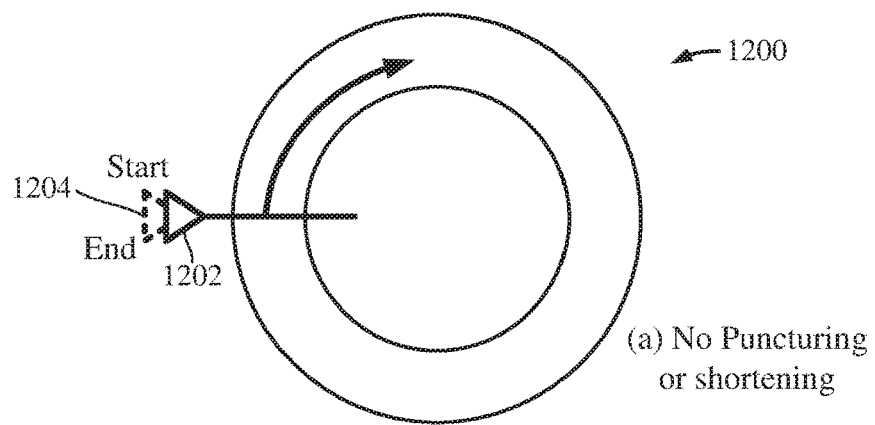
FIG. 12 illustrates an example circular buffer, in accordance with certain aspects of the present disclosure.
Figure 12:
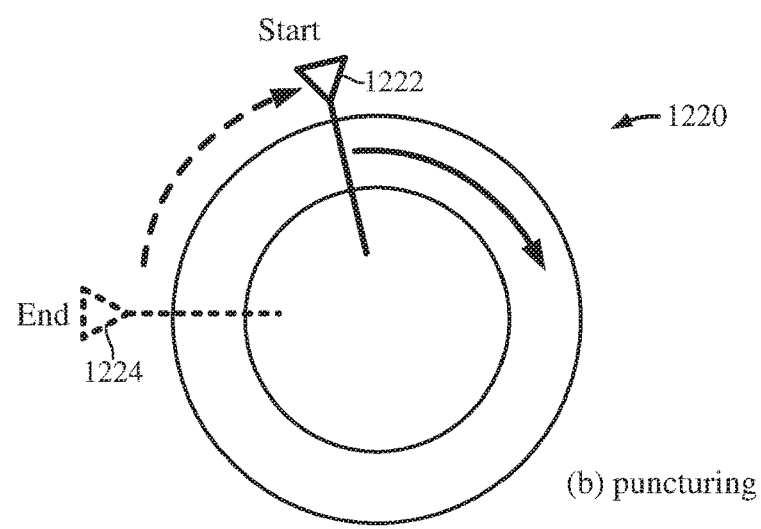
Figure 12:
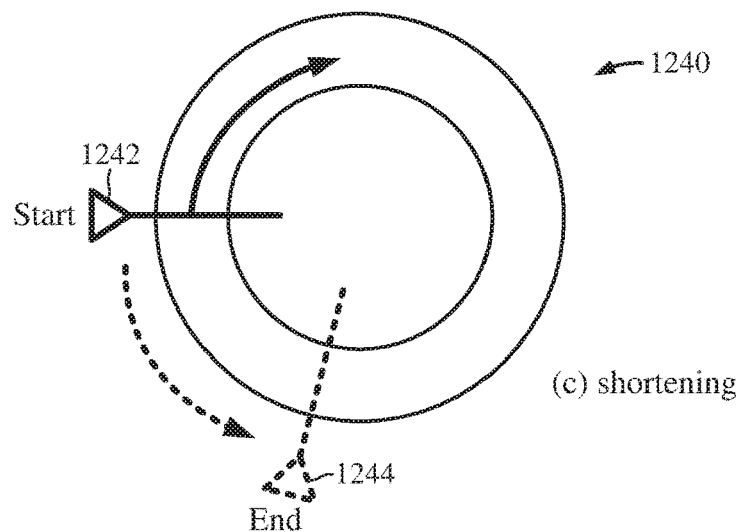

FIG. 12 illustrates usage of exemplary buffers 1200, 1220, and 1240, with polar coding, according to previously known techniques. In the circular buffer 1200, no puncturing or shortening of the coded data bits is performed, and the coded data bits are read out of the circular buffer starting from a starting point 1202 and ending an endpoint 1204 that coincides with the starting point. In the circular buffer 1220, the coded data bits 1226 between the end position 1224 (e.g., N−M) and the start position 1222 (e.g., N−1) are selected for puncturing. In the circular buffer 1240, the coded data bits 1246 between the start position 1242 (e.g., 0) and the end position 1244 (e.g., M−1) are selected, for shortening.

According to aspects of the present disclosure, techniques for iterative segmentation of large groups of (XI bits are provided. In the disclosed techniques, for an UCI payload (K, M) (i.e., K data bits that are to be encoded into M encoded bits), after segmentation into two packets (e.g., stage 1 segmentation), the payload and coded bits after the segmentation are denoted as $(K^{(1)}, M^{(1)})$ and $(K^{(2)}, M^{(2)})$ for the first and second packets, respectively. If either of $(K^{(1)}, M^{(1)})$ or $(K^{(2)}, M^{(2)})$ satisfy the condition for segmentation (e.g., $K^{(1)}>K\_max$ or $K^{(2)}>K\_max$, as mentioned previously), then the packets may be further segmented into two packets each, $(K^{(1,1)}, M^{(1,1)}, K^{(1,2)}, M^{(1,2)})$, $(K^{(2,1)}, M^{(2,1)})$ and $(K^{(2,2)}, M^{(2,2)})$.

In aspects of the present disclosure, segmentation of data for encoding and transmission can be done iteratively, i.e., stage m segmentation is performed if any packet after stage m−1 segmentation satisfies the condition to cause the packet to be segmented. The segmentation stops if no packet satisfies the condition.

Figure 13:
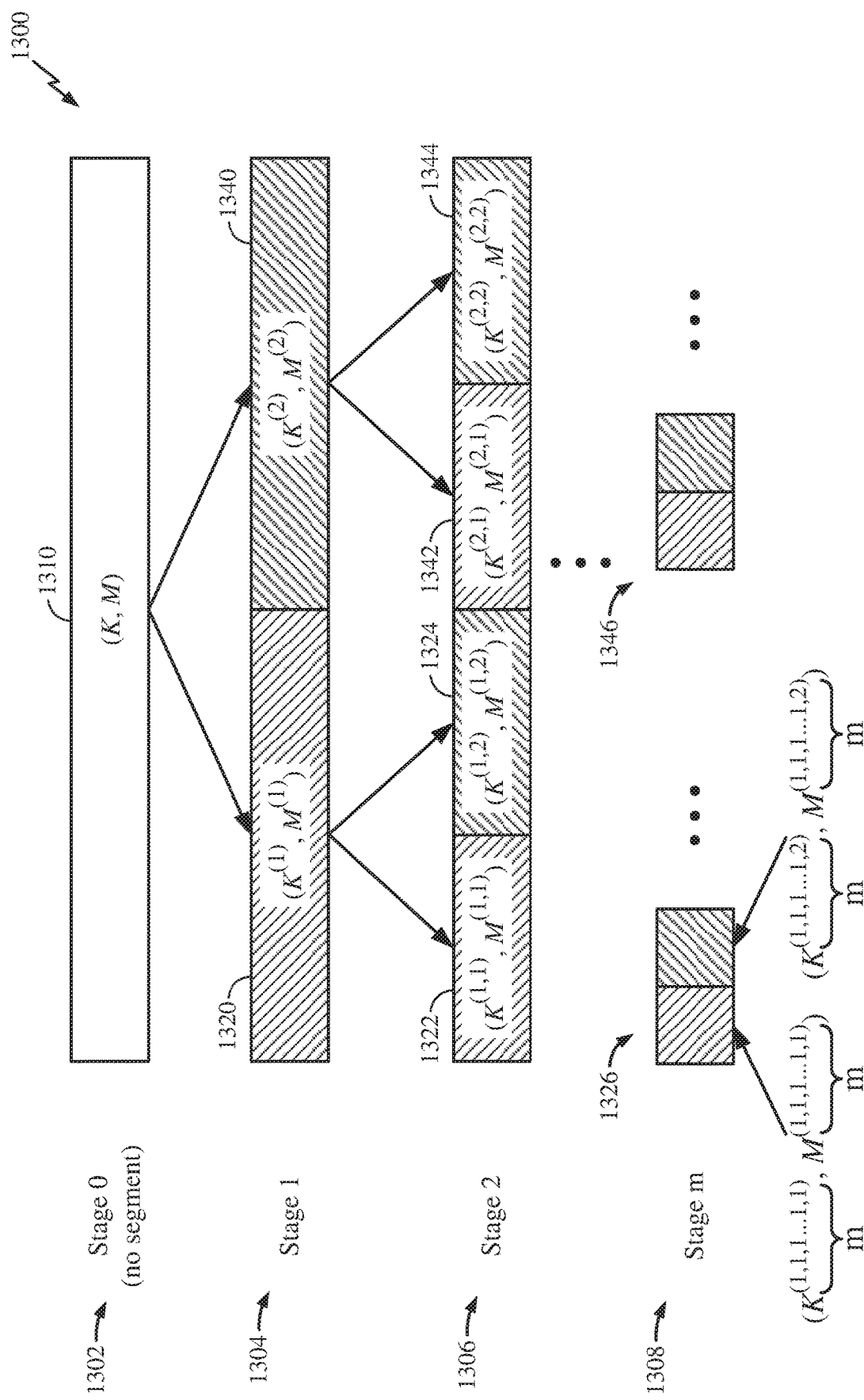
FIG. 13 illustrates an exemplary technique for iterative segmentation of large groups of hits, in accordance with certain aspects of the present disclosure.

FIG. 13 illustrates an exemplary technique 1300 for iterative segmentation of large groups of bits, according to aspects of the present disclosure. Stage 0 of the segmentation (e.g., before any segmentation occurs) is illustrated at 1302, wherein K data hits that are to be encoded in encoded data bits are shown. At 1304, stage 1 of the segmentation is shown, wherein the K bits 1310 are divided into $K^{(1,1)}$ bits 1320 that are to be encoded into $M^{(1,1)}$ encoded data bits and bits 1340 that are to be encoded into $M^{(2)}$ encoded data bits. Thus, after stage 1, $2^1=2$ packets exist. At 1306, stage 2 of the segmentation is shown, wherein the group of $K^{(1)}$ bits is divided into $K^{(1,1)}$ bits 1322 that are to be encoded into $M^{(1,1)}$ encoded data bits and $K^{(1,2)}$ bits 1324 that are to be encoded into $M^{(1,2)}$ encoded data bits. Similarly, the group of $K^{(2)}$ bits is divided into $K^{(2,1)}$ bits 1342 that are to be encoded into $M^{(2,1)}$ encoded data bits and $M^{(2,2)}$ bits 1344 that are to be encoded into $M^{(2,2)}$ encoded data bits. Thus, after stage 2, $2^2=4$ packets exist. At 1308, the groups of data bits 1326 and 1346 after stage m of the iterative segmentation are shown.

According to aspects of the present disclosure, using iterative segmentation as described herein may enable common polar code construction for all segmented packets. That is, each of the resulting segmented packets may be encoded with a common polar code. As illustrated in FIG. 13 at 1308, after stage in, a total of $2^m$ packets exist. Each packet can be constructed with the same (K', M'). K' data bits are in each packet segment after m stage segmentations, and each stage can contain padding bits in the first packet. That is, if K=9 (i.e., nine data bits), then after stage 1, $K^{(1)}=5$, with one bit of padding added to four data bits, and $K^{(2)}=5$ (i.e., five data bits); and after stage 2, $K^{(1,1)}=K^{(1,2)}=K^{(2,1)}=K^{(2,2)}=3$, with two padding bits (one added at stage and the other added at stage 2) and one data bit in the first packet segment, $K^{(1,1)}$; one padding bit in the first segment of the second pair of packet segments, $K^{(2,1)}$; and three data bits in the second segment of the first pair, $K^{(1,2)}$, and the second segment of the second pair, $K^{(2,2)}$.

In aspects of the present disclosure, the value N' to use in generating a polar code for encoding the packet segments is determined by selecting a minimum value of N for the segments, i.e., if $N^{(1,1)}=8$, $N^{(1,2)}=9$, $N^{(2,1)}=8$, $N^{(2,2)}=9$, then $N'=\min(N^{(1,1)}, N^{(1,2)}, N^{(2,1)}, N^{(2,2)})=8$. That is, if $N^{(1,2)}=9>=8$, then the one extra bit is treated by reading out from circular buffer, as shown previously in FIG. 12.

Figure 14:
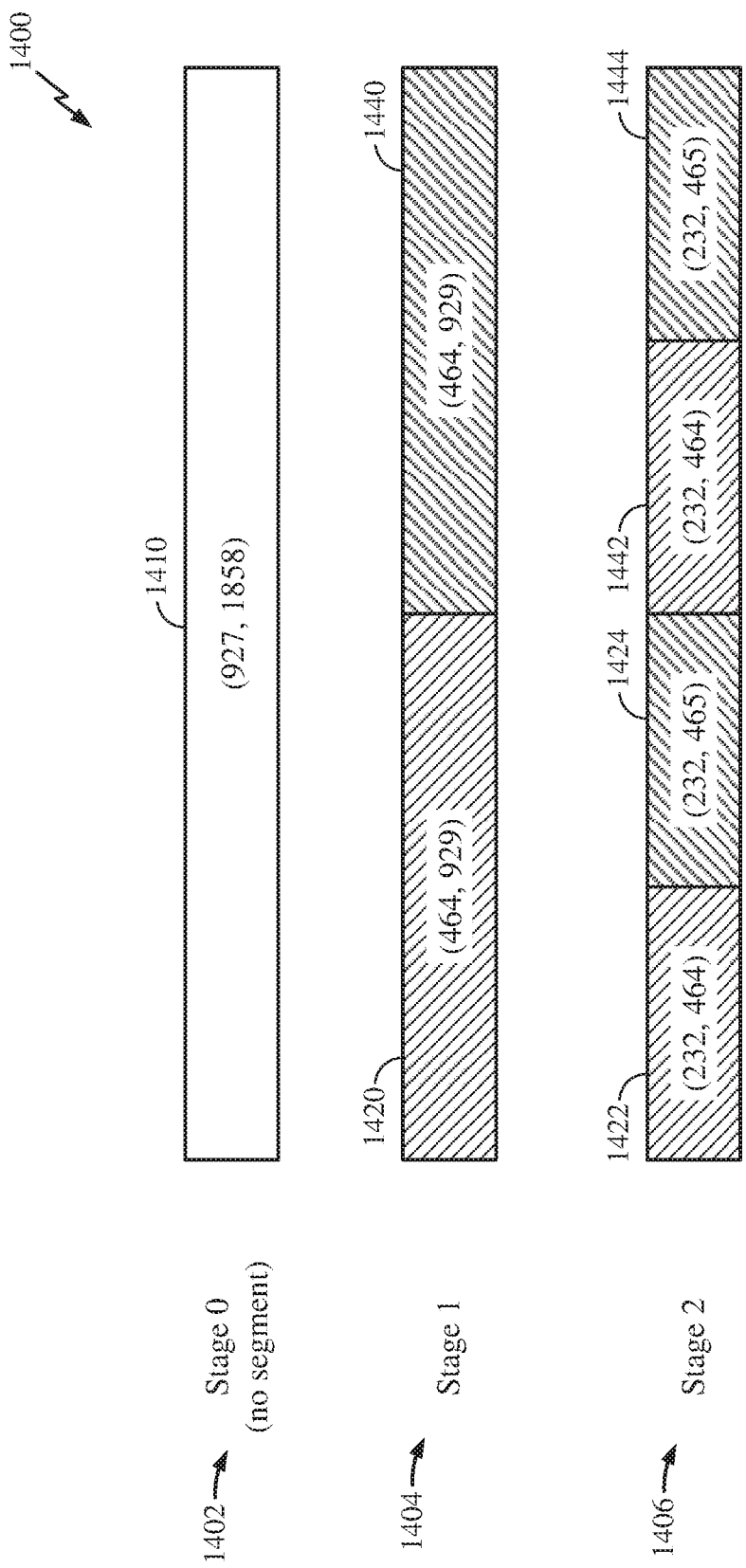
FIG. 14 illustrates an example process for iterative segmentation of a large group of UCI bits for encoding with a polar code, according to previously known techniques.

FIG. 14 illustrates an example process 1400 for iterative segmentation of a large group of UCI bits for encoding with a polar code, in accordance with aspects of the present disclosure. In the exemplary process, 927 bits 1410 (e.g., CSI with L=4, rank=2, 18 subbands for a single CSI report) of data to be encoded into 1858 bits for transmission using a polar code are represented at 1402. In the exemplary process, the 927 bits are divided into two groups of bits 1420 and 1440 of size 464 bits in stage 1 at 1404. Because 464×2=928, which is one larger than 9:27, an additional bit may be included in the first packet by repetition. In stage 2, shown at 1406, the bits of group 1420 are divided into to two groups 1422 and 1424, while the bits of group 1440 are also divided into two groups 1442 and 1444. In the illustrated example of 2 stage segmentation, (K', M')=(232, 464) may be used as parameters for construction of a polar code to encode all of the packets 1422, 1424, 1442, and 1444.

Figure 15:
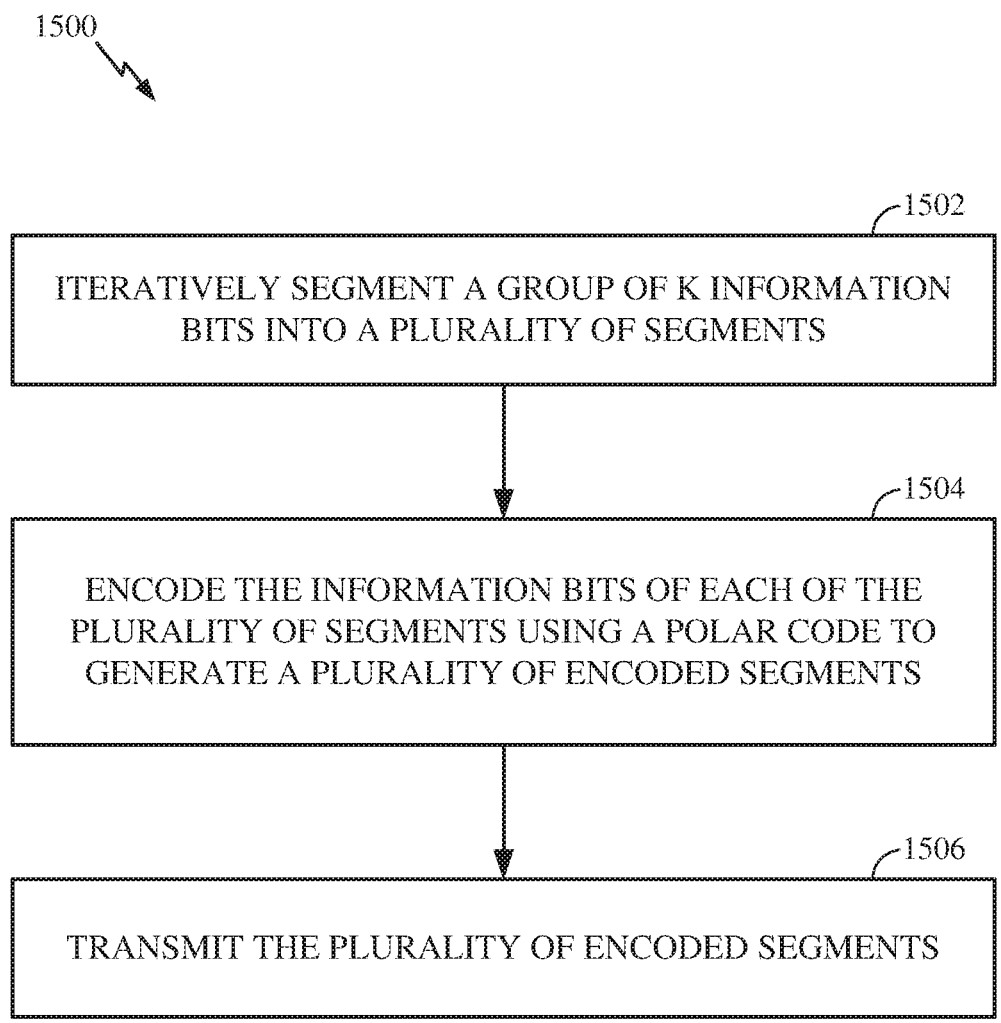
FIG. 15 illustrates example operations for wireless communications, according to aspects of the present disclosure.

FIG. 15 illustrates example operations 1500 for wireless communications, for example, for iterative segmentation of a group of bits for transmissions using polar codes, according to aspects of the present disclosure. Operations 1500 may be performed by a wireless communications device, such as a base station (BS 110), user equipment 120, and/or wireless communications device 602.

Operations 1500 begin at block 1502 with the wireless communications device iteratively segmenting a group of K information bits into a plurality of segments. For example, UE 120, shown in FIG. 1, iteratively segments 927 information bits into four segments, e.g., as shown above with reference to FIG. 14.

At block 1504, operations 1500 continue with the wireless communications device encoding the information bits of each of the plurality of segments using a polar code to generate a plurality of encoded segments. Continuing the example from above, the UE encodes the information bits of each of the four segments from block 1502 using a polar code to generate four encoded segments.

Operations 1500 continue at block 1506 with the wireless communications device transmitting the plurality of encoded segments. Continuing the example from above, the UE transmits the four encoded segments from block 1504.

Figure 16:
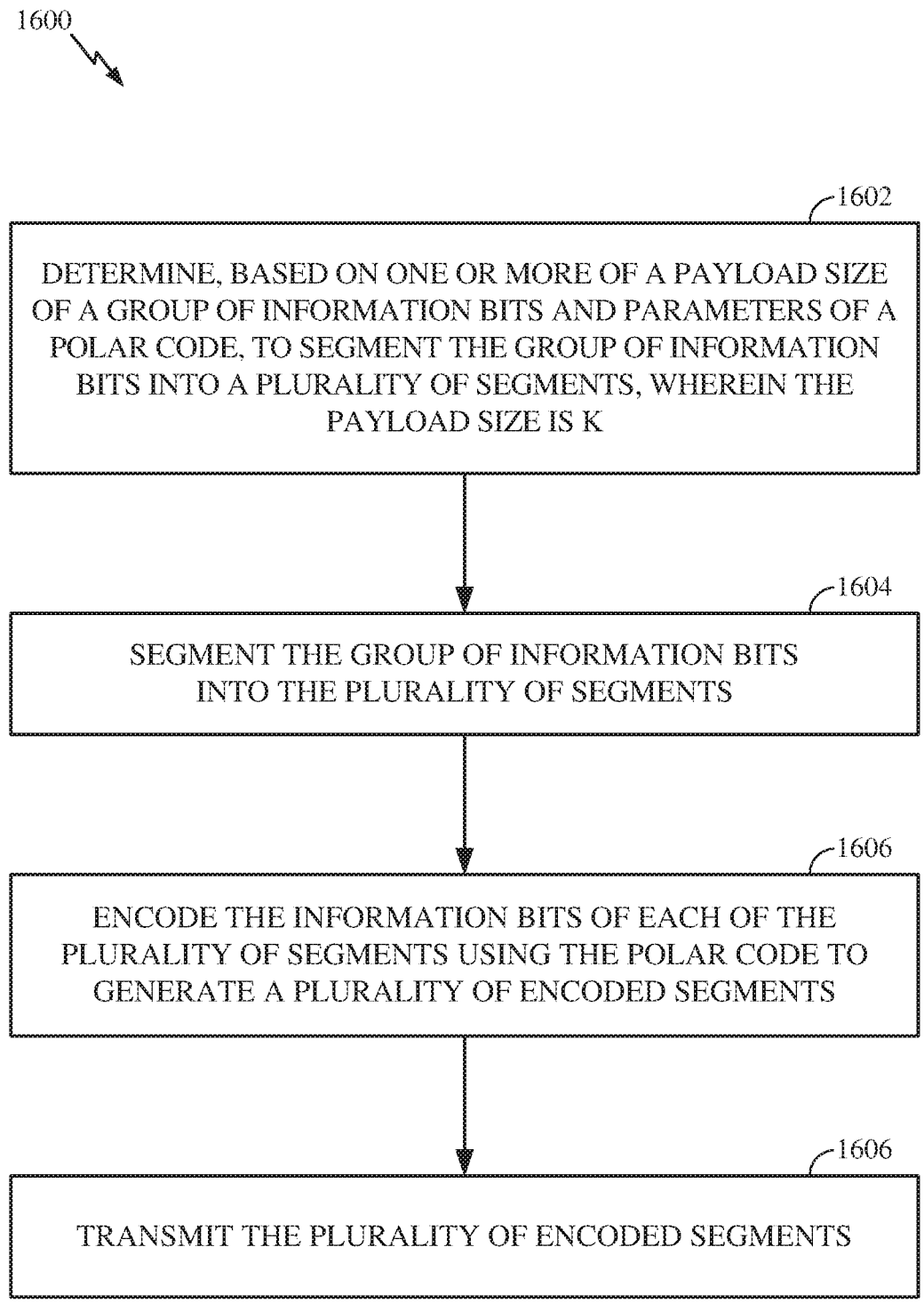
FIG. 16 illustrates example operations for wireless communications, accordance with certain aspects of the present disclosure.

FIG. 16 illustrates example operations 1600 for wireless communications, for example, for determining to segment a group of bits for transmissions using polar codes, according to aspects of the present disclosure. Operations 1600 may be performed by a wireless communications device, such as a base station (BS 110), user equipment 120, and/or wireless communications device 602.

Operations 1600 begin at block 1602 by the wireless communications device determining, based on one or more of a payload size of a group of information bits and parameters of a polar code, to segment the group of information bits into a plurality of segments, wherein the payload size is K. For example, UE 120, shown in FIG. 1, determines, based on a payload size of a group of information bits being 1013, to segment the group of 1013 information bits into two segments (e.g., code blocks).

At block 1604, operations 1600 continue with the wireless communications device segmenting the group of information bits into the plurality of segments. Continuing the example from above, the UE segments the group of information bits from block 1602 into two segments (e.g., code blocks), with the first (e.g., a first code block) having 507 information bits, one of which is a repeated bit, and the second segment (e.g., a second code block) having 507 information bits.

Operations 1600 continue at block 1606 with the wireless communications device encoding the information bits of each of the plurality of segments using the polar code to generate a plurality of encoded segments. Continuing the example from above, the UE encodes the information bits in each of the first segment (e.g., the first code block) and the second (e.g., the second code block) from block 1604 to generate a first encoded segment and a second encoded segment.

At 1608, operations 1600 continue with the wireless communications device transmitting the plurality of encoded segments. Continuing the example from above, the UE transmits the first encoded segment and the second encoded segment of block 1606.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b-b, b-b-c, c-c, and c-c-c or any other ordering of a, b, and c).

As used herein, the term "determining" encompasses a wide variety of actions. For example, mining may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RE front end for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting, means for receiving, means for determining, means for performing (e.g., rate-matching), means for encoding, means for, puncturing, means for repeating, means for shortening, and/or means for generating may comprise one or more processors or antennas at the BS 110 or UE 120, such as the transmit processor 220, controller/processor 240, receive processor 238, or antennas 234 at the BS 110 and/or the transmit processor 264, controller/processor 280, receive processor 258, or antennas 252 at the UE 120.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some, of the instructions into cache to increase access speed. One or more cache tines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared JR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood ha the claims are not limited to the precise configuration and components illustrated above. Various modifications, changes and variations may be made in the arrangement, operation and details of the methods and apparatus described above without departing from the scope of the claims.

The invention claimed is:

1. A method for wireless communications performed by a user equipment (UE), comprising:
   iteratively segmenting a group of K information bits into a plurality of segments of information bits, wherein iteratively segmenting the group of K information bits comprises segmenting the group of K information bits in a series of stages, wherein a first stage of the series comprises:
      segmenting the K information bits into a first resulting segment including $K^{(1)}$ information bits and a second resulting segment including $K^{(2)}$ information bits, wherein:
         when K is even, $K^{(1)}$=K/2 and $K^{(2)}$=K/2, and
         when K is odd, $K^{(1)}$=(K−1)/2 and $K^{(2)}$=(K+1)/2;
      adding zero padding bits to the first resulting segment, when K is even; and
      adding one padding bit to the first resulting segment, when K is odd;
   encoding the information bits of each of the plurality of segments of information bits using a polar code to generate a plurality of encoded segments; and
   transmitting the plurality of encoded segments.

2. The method of claim 1, wherein iteratively segmenting a second stage and each succeeding stage of the series comprises:
   segmenting each of the resulting segments of the immediately preceding stage into two new resulting segments, wherein:
      when a number of bits of the resulting segment of the immediately preceding stage is even, then each of the two new resulting segments has ½ of the number of bits of the resulting segment of the immediately preceding state,
      when a number of bits of the resulting segment of the immediately preceding stage is odd, then a first new resulting segment has (the number of bits of the resulting segment of the immediately preceding stage−1)/2 bits and a second new resulting segment has (the number of bits of the resulting segment of the immediately preceding stage+1)/2 bits;
   adding zero padding bits to the first new resulting segment, when the number of bits of the resulting segment of the immediately preceding stage is even; and
   adding one padding bit to the first new resulting segment, when the number of bits of the resulting segment of the immediately preceding stage is odd.

3. The method of claim 1, further comprising determining to iteratively segment a group of K information bits into a plurality of segments of information bits based on a maximum mother code length, Nmax, of polar codes supported by the UE and K.

4. The method of claim 1, further comprising:
   determining a coding rate with segmentation, R_seg, based on K, a cyclic redundancy check (CRC) length, a mother code length of the polar code after rate matching with segmentation, and a coded bit length, M; and
   determining a coding rate without segmentation, R_noseg, based on K, a cyclic redundancy check (CRC) length, a mother code length of the polar code after rate matching without segmentation, and a coded bit length, M, wherein the determination to iteratively segment the group of K information bits is based on R_seg being less than R_noseg.

5. The method of claim 4, wherein:
   R_seg=(K/2+CRC length)/min(mother code length of the polar code after rate matching with segmentation, (M/2)), and
   R_noseg=(K+CRC length)/min(mother code length of the polar code after rate matching without segmentation, (M)).

6. The method of claim 1, wherein transmitting each encoded segment comprises:
   writing each coded bit of the encoded segment to a circular buffer having a size equal to a size, N, of the polar code, wherein the coded bits are written in an order dependent on N;
   reading M coded bits from the circular buffer; and
   transmitting the M coded bits.

7. A method for wireless communications performed by a user equipment (UE), comprising:
   determining, based on one or more of K and parameters of a polar code, to iteratively segment a group of K information bits into a plurality of segments, wherein the determination is based on:
      K being greater than a threshold number of information bits, K_thr,
      a coding rate, R, being greater than a threshold coding rate, R_thr, and
      a coded bit length, M, being greater than a threshold coded bit length, M_thr;
   iteratively segmenting the group of K information bits into the plurality of segments;
   encoding the information bits of each of the plurality of segments using a polar code to generate a plurality of encoded segments; and
   transmitting the plurality of encoded segments.

8. A method for wireless communications performed by a user equipment (UE), comprising:
  determining, based on one or more of K and parameters of a polar code, to iteratively segment a group of K information bits into a plurality of segments,
  determining a threshold coded bit length, M_thr, based on a maximum mother code length of polar codes supported by the UE, wherein the determination to iteratively segment the group of K information bits is based on K being greater than a threshold number of information bits, K_thr, and a coded bit length, M, being greater than M_thr;
  iteratively segmenting the group of K information bits into the plurality of segments;
  encoding the information bits of each of the plurality of segments using a polar code to generate a plurality of encoded segments; and
  transmitting the plurality of encoded segments.

9. A method for wireless communications performed by a user equipment (UE), comprising:
  determining, based on one or more of a payload size of a group of information bits and parameters of a polar code, to segment the group of information bits into a plurality of segments, wherein the payload size is K, and wherein the determination is based on:
    K being greater than a threshold number of bits, K_thr,
    a coding rate, R, being greater than a threshold coding rate, R_thr, and
    a coded bit length, M, being greater than a threshold coded bit length, M_thr;
  segmenting the group of information bits into the plurality of segments;
  encoding the information bits of each of the plurality of segments using the polar code to generate a plurality of encoded segments; and
  transmitting the plurality of encoded segments.

10. The method of claim 9, wherein the determination is based on a maximum mother code length, Nmax, of polar codes supported by the UE, and K.

11. The method of claim 9, further comprising:
  determining a coding rate with segmentation, R_seg, based on K, a cyclic redundancy check (CRC) length, a mother code length of a polar code after rate matching with segmentation, and a coded bit length, M; and
  determining a coding rate without segmentation, R_noseg, based on K, a cyclic redundancy check (CRC) length, a mother code length of a polar code after rate matching without segmentation, and a coded bit length, M, wherein the determination to segment the group of information bits is based on R_seg being less than R_noseg.

12. The method of claim 11, wherein:
  R_seg=(K/2+CRC length)/min(mother code length of the polar code after rate matching with segmentation, (M/2)), and
  R_noseg=(K+CRC length)/min(mother code length of the polar code after rate matching without segmentation, (M)).

13. The method of claim 9, wherein transmitting each encoded segment comprises:
  writing each coded bit of the encoded segment to a circular buffer having a size equal to a size, N, of the polar code, wherein the bits are written in an order dependent on N;
  reading M coded bits from the circular buffer; and
  transmitting the M coded bits.

14. The method of claim 9, wherein the determination to segment the group of information bits is based on K being greater than or equal to a threshold payload size, K_thr.

15. The method of claim 14, wherein K_thr=1013.

16. A method for wireless communications performed by a user equipment (UE), comprising:
  determining, based on one or more of a payload size of a group of information bits and parameters of a polar code, to segment the group of information bits into a plurality of segments, wherein the payload size is K, and wherein the determination to segment the group of information bits is based on:
    K being greater than or equal to a threshold payload size, K_thr, and
    a coded bit length, M, being greater than or equal to a threshold coded bit length M_thr;
  segmenting the group of information bits into the plurality of segments;
  encoding the information bits of each of the plurality of segments using the polar code to generate a plurality of encoded segments; and
  transmitting the plurality of encoded segments.

17. The method of claim 16, wherein K_thr=360 and M_thr=1088.

18. An apparatus for wireless communications, comprising:
  a processor configured to:
    iteratively segment a group of K information bits into a plurality of segments of information bits by segmenting the group of K information bits in a series of stages, wherein a first stage of the series comprises:
      segmenting the K information bits into a first resulting segment including $K^{(1)}$ information bits and a second resulting segment including $K^{(2)}$ information bits, wherein:
        when K is even, $K^{(1)}$=K/2 and $K^{(2)}$=K/2,
        when K is odd, $K^{(1)}$=(K−1)/2 and $K^{(2)}$=(K+1)/2;
      adding zero padding bits to the first resulting segment, when K is even; and
      adding one padding bit to the first resulting segment, when K is odd;
    encode the information bits of each of the plurality of segments of information bits using a polar code to generate a plurality of encoded segments; and
    cause the apparatus to transmit the plurality of encoded segments; and
  a memory coupled with the processor.

19. The apparatus of claim 9, wherein the processor is configured to iteratively segment the group of K information bits in a second stage and each succeeding stage of the series by:
  segmenting each of the resulting segments of the immediately preceding stage into two new resulting segments, wherein:
    when a number of bits of the resulting segment of the immediately preceding stage is even, then each of the two new resulting segments has ½ of the number of bits of the resulting segment of the immediately preceding state,
    when a number of bits of the resulting segment of the immediately preceding stage is odd, then a first new resulting segment has (the number of bits of the resulting segment of the immediately preceding stage−1)/2 bits and a second new resulting segment has (the number of bits of the resulting segment of the immediately preceding stage+1)/2 bits;

adding zero padding bits to the first new resulting segment, when the number of bits of the resulting segment of the immediately preceding stage is even; and adding one padding bit to the first new resulting segment, when the number of bits of the resulting segment of the immediately preceding stage is odd.

20. The apparatus of claim 18, wherein the processor is further configured to determine to iteratively segment the group of K information bits based on a maximum mother code length, Nmax, of polar codes supported by the apparatus and K.

21. The apparatus of claim 18, wherein the apparatus is further configured to:
   determine a coding rate with segmentation, R_seg, based on K, a cyclic redundancy check (CRC) length, a mother code length of the polar code after rate matching with segmentation, and a coded bit length, M;
   determine a coding rate without segmentation, R_noseg, based on K, a cyclic redundancy check (CRC) length, a mother code length of the polar code after rate matching without segmentation, and a coded bit length, M; and
   determine to iteratively segment the group of K information bits based on R_seg being less than R_noseg.

22. The apparatus of claim 21, wherein the processor is configured to:
   determine R_seg=(K/2+CRC length)/min(mother code length of the polar code after rate matching with segmentation, (M/2)), and
   determine R_noseg=(K+CRC length)/min(mother code length of the polar code after rate matching without segmentation, (M)).

23. The apparatus of claim 18, wherein causing the apparatus to transmit each encoded segment comprises:
   writing each coded bit of the encoded segment to a circular buffer having a size equal to a size, N, of the polar code, wherein the coded bits are written in an order dependent on N;
   reading M coded bits from the circular buffer; and
   causing the apparatus to transmit the M coded bits.

24. An apparatus for wireless communications, comprising:
   a processor configured to:
      determine to iteratively segment group of K information bits into a plurality of segments based on:
         K being greater than a threshold number of information bits, K_thr,
         a coding rate, R, being greater than a threshold coding rate, R_thr, and
         a coded bit length, M, being greater than a threshold coded bit length, M_thr;
      iteratively segment the group of K information bits into the plurality of segments;
      encode the information bits of each of the plurality of segments using a polar code to generate a plurality of encoded segments; and
      cause the apparatus to transmit the plurality of encoded segments; and
   a memory coupled with the processor.

25. An apparatus for wireless communications, comprising:
   a processor configured to:
      determine to iteratively segment a group of K information bits into a plurality of segments;
      determine a threshold coded bit length, M_thr, based on a maximum mother code length of polar codes supported by the apparatus, wherein the determination to iteratively segment the group of K information bits is based on K being greater than a threshold number of information bits, K_thr, and a coded bit length, M, being greater than M_thr;
      iteratively segment the group of K information bits into the plurality of segments;
      encode the information bits of each of the plurality of segments using a polar code to generate a plurality of encoded segments; and
      cause the apparatus to transmit the plurality of encoded segments; and
   a memory coupled with the processor.

26. An apparatus for wireless communications, comprising:
   a processor configured to:
      determine, based on one or more of a payload size of a group of information bits and parameters of a polar code, to segment the group of information bits into a plurality of segments, wherein the payload size is K, and wherein the determination is based on:
         K being greater than a threshold number of bits, K_thr,
         a coding rate, R, being greater than a threshold coding rate, R_thr, and
         a coded bit length, M, being greater than a threshold coded bit length, M_thr;
      segment the group of information bits into the plurality of segments;
      encode the information bits of each of the plurality of segments using the polar code to generate a plurality of encoded segments; and
      cause the apparatus to transmit the plurality of encoded segments; and
   a memory coupled with the processor.

27. The apparatus of claim 26, wherein the processor is configured to determine to segment the group of information bits based on a maximum mother code length, Nmax, of polar codes supported by the apparatus, and K.

28. The apparatus of claim 26, wherein the processor is further configured to:
   determine a coding rate with segmentation, R_seg, based on K, a cyclic redundancy check (CRC) length, a mother code length of a polar code after rate matching with segmentation, and a coded bit length, M;
   determine a coding rate without segmentation, R_noseg, based on K, a cyclic redundancy check (CRC) length, a mother code length of a polar code after rate matching without segmentation, and a coded bit length, M; and
   determine to segment the group of information bits based on R_seg being less than R_noseg.

29. The apparatus of claim 28, wherein the processor is configured to:
   calculate R_seg=(K/2+CRC length)/min(mother code length of the polar code after rate matching with segmentation, (M/2)), and
   calculate R_noseg=(K+CRC length)/min(mother code length of the polar code after rate matching without segmentation, (M)).

30. The apparatus of claim 26, wherein causing the apparatus to transmit each encoded segment comprises:
   writing each coded bit of the encoded segment to a circular buffer having a size equal to a size, N, of the polar code, wherein the bits are written in an order dependent on N;
   reading M coded bits from the circular buffer; and
   causing the apparatus to transmit the M coded bits.

31. The apparatus of claim 26, wherein the processor is configured to determine to segment the group of information bits based on K being greater than or equal a threshold payload size, K_thr.

32. The apparatus of claim 31, wherein K_thr=1013.

33. An apparatus for wireless communications, comprising:
a processor configured to:
determine, based on one or more of a payload size of a group of information bits and parameters of a polar code, to segment the group of information bits into a plurality of segments, wherein the payload size is K, and wherein the determination is based on:
K being greater than or equal to a threshold payload size, K_thr, and
a coded bit length, M, being greater than or equal to a threshold coded bit length M_thr;
segment the group of information bits into the plurality of segments;
encode the information bits of each of the plurality of segments using the polar code to generate a plurality of encoded segments; and
cause the apparatus to transmit the plurality of encoded segments; and
a memory coupled with the processor.

34. The apparatus of claim 33, wherein K_thr=360 and M_thr=1088.

* * * * *